(12) United States Patent
Ovshinsky

(10) Patent No.: US 7,547,906 B2
(45) Date of Patent: Jun. 16, 2009

(54) MULTI-FUNCTIONAL CHALCOGENIDE ELECTRONIC DEVICES HAVING GAIN

(75) Inventor: Stanford R. Ovshinsky, Bloomfield Hills, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 11/438,709

(22) Filed: May 22, 2006

(65) Prior Publication Data

US 2007/0267624 A1 Nov. 22, 2007

(51) Int. Cl.
*H01L 47/00* (2006.01)
(52) U.S. Cl. ............... 257/3; 257/2; 257/4; 257/5; 257/E45.002; 257/E45.003
(58) Field of Classification Search ............ 438/585, 438/624, 102–103; 257/2–5, E45.002–E45.003
See application file for complete search history.

(56) References Cited

U.S. PATENT DOCUMENTS

| | | | |
|---|---|---|---|
| 5,166,758 A | 11/1992 | Ovshinsky | |
| 5,296,716 A | 3/1994 | Ovshinsky | |
| 5,534,711 A | 7/1996 | Ovshinsky | |
| 5,536,947 A | 7/1996 | Klersy | |
| 5,543,737 A | 8/1996 | Ovshinsky | |
| 5,596,522 A | 1/1997 | Ovshinsky | |
| 5,694,146 A | 12/1997 | Ovshinsky | |
| 5,757,446 A | 5/1998 | Ovshinsky | |
| 5,789,758 A * | 8/1998 | Reinberg | 257/3 |
| 6,087,674 A | 7/2000 | Ovshinsky | |
| 6,967,344 B2 | 11/2005 | Ovshinsky | |
| 6,969,867 B2 | 11/2005 | Ovshinsky | |
| 2004/0178403 A1* | 9/2004 | Ovshinsky | 257/4 |
| 2006/0255392 A1* | 11/2006 | Cho et al. | 257/310 |
| 2006/0257787 A1* | 11/2006 | Kuo et al. | 430/270.13 |
| 2007/0099405 A1* | 5/2007 | Oliva et al. | 438/585 |

\* cited by examiner

*Primary Examiner*—Kiesha L Rose
*Assistant Examiner*—Minchul Yang
(74) *Attorney, Agent, or Firm*—Kevin L. Bray

(57) ABSTRACT

Multi-functional electronic switching and current control device comprising a chalcogenide material. The devices include a load terminal, a reference terminal and a control terminal. Application of a control signal to the control terminal permits the device to function in one or more of the following modes reversibly: (1) a gain mode in which gain is induced in the current passing between the load and reference terminals; (2) a conductivity modulation mode in which the conductivity of the chalcogenide material between the load and reference terminals is modulated; (3) a current modulation mode in which the current or current density between the load and reference terminals is modulated; and/or (4) a threshold modulation mode in which the voltage required to switch the chalcogenide material between the load and reference terminals from a resistive state to a conductive state is modulated. The devices may be used as interconnection devices or signal providing devices in circuits and networks.

21 Claims, 13 Drawing Sheets

MULTI-FUNCTIONAL CHALCOGENIDE ELECTRONIC DEVICES HAVING GAIN

FIELD OF THE INVENTION

This invention relates generally to chalcogenide electronic devices. More particularly, this invention relates to modification, amplification and multi-functional switching devices. Most particularly, this invention pertains to multi-terminal switching and control devices in which the application of a control signal at a control terminal regulates the operation of the device to provide new functionality, in a non-silicon computing platform, that surpasses a transistor.

BACKGROUND OF THE INVENTION

Today's electronic devices rely on conventional silicon technology. With silicon technology, one can fabricate the electronic components (e.g. transistors, diodes, switches, memory, integrated circuits and processors) needed to produce modern computers and consumer electronic products. Silicon-based electronics have enjoyed great success in the market place and have provided a number of conveniences that have greatly simplified everyday life.

The growth of silicon-based electronics over the past few decades has been propelled by the enormous strides that have been made in the miniaturization of devices during manufacturing. Miniaturization trends have faithfully followed Moore's Law for many years over many generations of silicon technology. As device feature sizes decrease, it becomes possible to include ever more devices in a given area of a silicon wafer and to achieve improved performance and speed from computers and electronic products.

Since future improvements in computing power and functionality are currently predicated on further improvements in silicon technology, there has been much recent discussion about the prognosis for continued miniaturization of silicon-based electronic devices. A growing consensus is emerging that believes that the computer industry is rapidly approaching the performance limits of silicon. The feature size in today's manufacturing technologies is 0.18 micron and it is expected that this can be reduced to about 0.10 micron in the future. Further decreases in feature size, however, are deemed problematic because sizes below about 0.10 micron are expected lead to a change in the fundamental behavior of silicon. More specifically, as the dimensions of silicon devices decrease to tens of nanometers and below, silicon enters the quantum regime of behavior and no longer functions according to the classical physics that governs macroscopic objects. In the quantum regime, energy states are quantized rather than continuous and phenomena such as tunneling lead to delocalization of electrons across many devices. Consequences of tunneling include leakage of current as electrons escape from one device to neighboring devices and a loss of independence of devices as the state of one device influences the state of neighboring devices. In addition to fundamental changes in the behavior of silicon, further decreases in the dimensions of silicon devices also pose formidable technological challenges. New innovations in fabrication methods such as photolithography will be needed to achieve smaller feature sizes.

Two other drawbacks of silicon technology have been identified. First, the costs of installing and operating new manufacturing facilities have increased exponentially as feature sizes have decreased. At today's 0.18 micron feature size, for example, the cost of building a new semiconductor fabrication facility readily exceeds a billion dollars. This cost will only increase as devices become smaller and more susceptible to impurities and process contamination. Second, there is growing recognition that the functionality of silicon-based computers is inherently limited as certain computations remain largely unamenable to solution by modern computers. Examples include factoring, high density parallel computing, pattern recognition and associative memory. Similarly, many tasks that are readily and intuitively performed by humans and other biological organisms are difficult, cumbersome and oftentimes impossible to implement with conventional computers.

Consideration of the future of computing indicates a need for new computers with new functionality to address ever more sophisticated applications. New computers that are adaptable and flexible and that operate according to reasoning and intelligence are needed. A need exists for computers that are not limited to the rigid, brute force problem solving methodology of conventional computers. Instead, computers are needed that can respond to changing situations with an ability to discriminate information from multiple sources to provide reasoned outputs, even in the face of seemingly conflicting circumstances. The functionality required to achieve intelligent computers and devices extends beyond the current and projected performance capabilities of the silicon technology underlying conventional computers. Consequently, a need exists for a new and revolutionary computing paradigm that encompasses general purpose computers and task-specific computing devices as well as their underlying electronic components and materials.

SUMMARY OF THE INVENTION

The instant invention provides electronic devices that can be used in the construction of novel computers and computing devices having greater functionality than today's conventional computers. The instant devices are not based on silicon, but rather on chalcogenide phase change materials that can be reversibly transformed between resistive and conductive states. The instant chalcogenide devices can be combined with other chalcogenide devices to achieve a fully functional non-silicon based computing platform or can be readily interfaced or interconnected with silicon wafers and silicon-based devices to provide a fully functional hybrid computing platform.

In one embodiment, transformations between states are effected by providing energy to the phase change material in an amount meeting or exceeding a threshold energy. Application of at least a threshold amount of energy from an external source to a resistive state causes the material to switch to a conductive state. The conductive state persists as long as a minimum amount of external energy is provided to the material. Upon termination of the external energy, the material may return to a resistive state.

The instant invention includes multifunctional electronic devices that include three or more terminals in electrical communication with a chalcogenide material. The devices include a load terminal, a reference terminal, and a control terminal. Application of a control signal to the control terminal permits the device to function in one or more of the following modes reversibly: (1) a conductivity modulation mode in which the conductivity of the chalcogenide material between the load and reference terminals is modulated; (2) a current modulation mode in which the current or current density between the load and reference terminals is modulated; and/or (3) a threshold modulation mode in which the voltage required to switch the chalcogenide material between the load and reference terminals from a resistive state to a conductive state is modulated.

In one embodiment, the instant device includes three or more terminals in electrical communication with a chalcogenide material where a time-varying and/or polarity-varying signal applied to one of the terminals reversibly modulates the current, current density, conductivity, or threshold voltage between two other terminals. Reversible modulation may occur while preventing the chalcogenide material of the device from latching.

In another embodiment, the instant device includes three or more terminals in electrical communication with a chalcogenide material where the chalcogenide material can be switched from a resistive state to a conductive state between one pair of terminals upon application of a threshold voltage between the terminals, but where the chalcogenide material cannot be switched from a resistive state to a conductive state between a different pair of terminals.

In another embodiment, the instant device includes three or more terminals in electrical communication with a chalcogenide material where the chalcogenide material can transmit currents between two or more pairs of terminals without switching from a resistive state to a conductive state. In a preferred embodiment, the chalcogenide material does not switch while simultaneously transmitting currents between two or more pairs of terminals. In another preferred embodiment, the device is operable in a subthreshold mode in which the current transmitted between a pair of terminals is less than the threshold current of the chalcogenide material between the terminals.

In another embodiment, the instant device includes three or more terminals in electrical communication with a chalcogenide material where the device has an asymmetric structure in which one of the three terminals is spacedly disposed between two other terminals and is located in closer spatial proximity to one of the other two terminals than to the other of the other two terminals.

In another embodiment, chalcogenide devices providing for gain or amplification of current are provided. In this embodiment, the device is configured a device is operated in a sub-threshold mode in which a current below the threshold current needed to maintain a conductive state is provided between a pair of terminals and a signal supplied to a control terminal enables gain. This embodiment provides for transistor-like functionality in a chalcogenide device and enables a computing platform based solely on combinations of chalcogenide devices that fully perform the logic, memory, and processing functions of a computer.

The instant chalcogenide gain and switching devices can be linked to other devices to form a network. In a network, the instant switching devices may be used as interconnect devices to regulate the flow of electrical energy and signals between devices or circuit elements in the network.

DETAILED DESCRIPTION

The instant invention provides electronic current amplification and switching devices based on chalcogenide materials. The switching properties of the chalcogenide materials are widely known and have been previously exploited in OTS (Ovonic Threshold Switch) devices. The OTS has been described in U.S. Pat. Nos. 5,543,737; 5,694,146; and 5,757,446; the disclosures of which are hereby incorporated by reference, as well as in many journal articles including "Reversible Electrical Switching Phenomena in Disordered Structures", Physical Review Letters, vol. 21, p. 1450-1453 (1968) by S. R. Ovshinsky; "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosures of which are hereby incorporated by reference.

Figure 1:
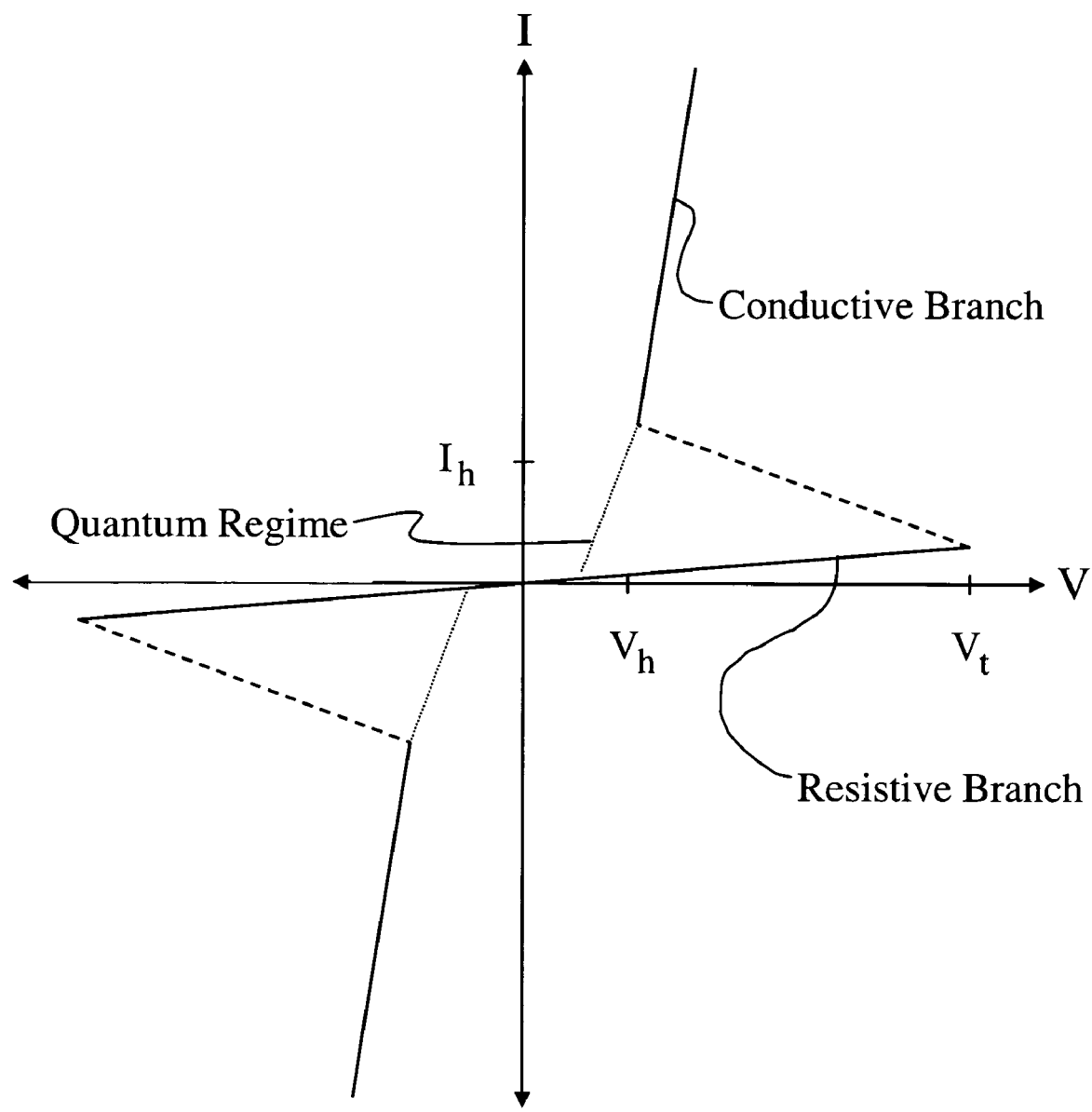
FIG. 1. I-V characteristics of a chalcogenide material exhibiting a switching transformation.

The electrical switching properties of the chalcogenide switching materials used in the instant devices are schematically illustrated in FIG. 1, which shows the I-V (current-voltage) characteristics of a chalcogenide switching material. The illustration of FIG. 1 corresponds to a two-terminal device configuration in which two spacedly disposed electrodes are in contact with a chalcogenide material and the current I corresponds to the current passing between the two electrodes. The I-V curve of FIG. 1 shows the current passing through the chalcogenide material as a function of the voltage applied across the material by the electrodes. The I-V characteristics of the material are symmetric with respect to the polarity of the applied voltage. For convenience, we consider the first quadrant of the I-V plot of FIG. 1 (the portion in which current and voltage are both positive) in the brief discussion of chalcogenide switching behavior that follows.

An analogous description that accounts for polarity applies to the third quadrant of the I-V plot.

The I-V curve includes a resistive branch and a conductive branch. The branches are labeled in FIG. 1. The resistive branch corresponds to the branch in which the current passing through the material increases only slightly upon increasing the voltage applied across the material. This branch exhibits a small slope in the I-V plot and appears as a nearly horizontal line in the first and third quadrants of FIG. 1. The conductive branch corresponds to the branch in which the current passing through the material increases significantly upon increasing the voltage applied across the material. This branch exhibits a large slope in the I-V plot and appears as a nearly vertical line in the first and third quadrants of FIG. 1. The slopes of the resistive and conductive branches shown in FIG. 1 are illustrative and not intended to be limiting, the actual slopes will depend on the chemical composition of the chalcogenide material and factors such as load resistances in the external circuitry. Regardless of the actual slopes, the conductive branch exhibits a larger slope than the resistive branch and signifies a more freely conducting state of the chalcogenide material than the resistive branch. When device conditions are such that the chalcogenide material is described by a point on the resistive branch of the I-V curve, the chalcogenide material or device may be said to be in a resistive state. When device conditions are such that the chalcogenide material is described by a point on the conductive branch of the I-V curve, the chalcogenide material or device may be said to be in a conductive state.

The switching properties of the chalcogenide material used in the switching embodiments of the instant devices can be described by reference to FIG. 1. We consider a two-terminal device configuration and begin with a device that has no voltage applied across it. When no voltage is applied across the chalcogenide material, the material is in a resistive state and no current flows. This condition corresponds to the origin of the I-V plot shown in FIG. 1. The chalcogenide remains in a resistive state as the applied voltage is increased, up to a threshold voltage (labeled $V_t$ in the first quadrant of FIG. 1). Associated with the threshold voltage is a threshold current (not labeled). The slope of the I-V curve for applied voltages between 0 and $V_t$ is small in magnitude and indicates that the chalcogenide material has a high electrical resistance, a circumstance reflected in the terminology "resistive branch" used to describe this portion of the I-V curve. The high resistance implies low electrical conductivity and as a result, the current flowing through the material increases only weakly as the applied voltage is increased. Since the current through the material is very small, the resistive state of the chalcogenide may also be referred to as the OFF state of the material.

When the applied voltage equals or exceeds the threshold voltage $V_t$, the chalcogenide material transforms (switches) from the resistive branch to the conductive branch of the I-V curve. The switching event occurs instantaneously and is depicted by the dashed line in FIG. 1. Upon switching, the device voltage decreases significantly and the device current becomes much more sensitive to changes in the device voltage. Since the current through the material is greatly increased, the conductive state of the chalcogenide may also be referred to as the ON state or the dynamic state of the material.

The chalcogenide material remains in the conductive branch as long as a minimum current, labeled $I_h$ in FIG. 1, is maintained. We refer to $I_h$ as the holding current and the associated voltage $V_h$ as the holding voltage of the device. If the device conditions after switching are changed so that the current becomes less than $I_h$, the material normally returns to the resistive branch of the I-V plot and requires re-application of a threshold voltage to resume operation on the conductive branch. If the current is only momentarily (a time less than the recovery time of the chalcogenide material) reduced below $I_h$, the conductive state of the chalcogenide may be recovered upon restoring the current to or above $I_h$. The recovery time of chalcogenide materials has been discussed in the article "Amorphous Semiconductors for Switching, Memory, and Imaging Applications" incorporated by reference hereinabove.

When the current of a device in the ON state is reduced below the holding current, the device relaxes along dotted line labeled "Quantum Regime" in FIG. 1 as the filament collapses. Progress along the dotted line is irreversible, the current continuously decreases until the device relaxes back to the resistive branch. FIG. 1 indicates a representative placement of the holding current on the I-V curve and specifically illustrates the common situation in which the holding current is below the current of the device immediately upon switching. The relative magnitudes of the holding current and current achieved immediately upon switching depend on factors such as the load resistance of the device and other factors related to the external circuit in which the device is placed. Although it is typical for the holding current to be less than the current obtained immediately upon switching, the circuitry and resistances can be configured so as to make the two currents coincide. Similarly, the relative magnitudes of the holding current and the threshold current may vary with the device configuration, chalcogenide composition, and external circuitry.

Analogous switching behavior occurs in the third quadrant of the I-V plot shown in FIG. 1. Provided one is cognizant of the negative polarity of the I-V curve in the third quadrant, the switching behavior in the third quadrant is analogous to that described hereinabove for the first quadrant. For example, applied voltages having a magnitude greater than the magnitude of the negative threshold voltage in the third quadrant induce switching from the resistive branch to the conductive branch. We further note that although the resistive branch, conductive branch and quantum regimes are depicted with linear representations in FIG. 1, in practice slightly non-linear or curved representations of these portions of the I-V curve may be observed. Factors such as loads or resistances in the circuit external to the device and non-uniformities or imperfections in device fabrication may influence the shape of the different portions of the I-V curve. Accordingly, the depiction provided in FIG. 1 is intended to be schematic and a qualitative representation of the behavior of an actual device in practical operation.

The switching effect of the instant devices originates from a transformation of the chalcogenide material from a resistive state to a conductive state upon application of a threshold voltage, $V_{th}$. While not wishing to be bound by theory, a model can be used to describe the phenomenon underlying the switching transformation. According to the model, application of the threshold voltage causes the formation of a conductive channel or filament within the chalcogenide material. At the threshold voltage, the electric field experienced by the material is sufficiently high to induce a liberation of charge carriers from bonds or lone pair orbitals of the chalcogenide material. In the liberation event, electrons are removed from atoms to form a highly conductive, plasma-like filament of charge carriers. Rather than being bound to atoms, some electrons become unbound and highly mobile. As a result, a conductive channel or filament forms. The conductive filament constitutes a conductive volume within the otherwise resistive chalcogenide material and may be referred to herein as a solid state plasma. This solid state plasma has a current density that can exceed $10^7$ A/cm$^2$. No other solid state plasma is capable of providing a current density anywhere close to this magnitude. The conductive filament extends through the chalcogenide material between the device terminals and provides a low resistance pathway for electrical current. Portions of the chalcogenide material outside of the filament may remain resistive. Since electric current traverses the path of least resistance, the presence of a conductive filament renders the chalcogenide material conductive and establishes a conductive state. The creation of a conductive filament is the event that underlies the switching of the chalcogenide material from a resistive state to a conductive state. Operation of a chalcogenide device so as to achieve a switching effect between a pair of terminals may be referred to herein as a switching mode of operation.

The conductive filament is maintained between the device terminals as long as the device current remains at or above the holding current. A conductive filament is present for all points along the conductive branch, but the cross sectional area of the filament may differ for different points along the conductive branch. The cross sectional area of the filament refers to directions lateral to the direction of current flow. Depending on operating conditions within the conductive branch, the filament can be narrow or wide. As the applied voltage is increased along the conductive branch, the cross section of the filament is enlarged as the applied voltage is increased. The enlarged filament indicates a greater volume of the chalcogenide material exhibits high conductivity. As a result, the chalcogenide material can support a greater current, as indicated by the conductive branch of the I-V curve, as the applied voltage increases. Variations of the voltage applied to a chalcogenide material operating in the conductive branch modify the width or thickness of the filament in directions lateral to the direction of current flow. The net effect of varying the applied voltage of a chalcogenide material operating in the conductive branch is to modify the volume fractions of the conductive and resistive portions. The current density may also be influenced.

As will be described in further detail hereinbelow, the instant invention provides devices having three or more terminals that permit not only operation along and switching between the resistive and conductive branches of the I-V curve, but also operation at currents below the holding current following switching of the device. This mode of operation may be referred to herein as a subthreshold or quantum control mode of operation and corresponds approximately to the regions of the I-V curve depicted with a dotted line and labeled "quantum regime" in FIG. 1. In this region, it becomes possible to operate the device in a current range below the holding current. Upon switching in a conventional chalcogenide-based switching device, the current jumps in an effectively discontinuous fashion from the low current level in the device while in its resistive state immediately prior to switching to a higher current level at or above the holding current. The range of current associated with the discontinuity has been heretofore inaccessible and unavailable for practical device operation. The multi-terminal devices of the instant invention permit operation of a device in this otherwise inaccessible range of current and, as described in greater detail hereinbelow, new functionality is achieved as a result.

Chalcogenide materials of many chemical compositions undergo the foregoing switching effect. Representative chalcogenide materials are those that include one or more elements from column VI of the periodic table (the chalcogen elements) and optionally one or more chemical modifiers from columns III. IV or V. One or more of S, Se, and Te are the most common chalcogen elements included in the active material of the instant devices. The chalcogen elements are characterized by divalent bonding and the presence of lone pair electrons. The divalent bonding leads to the formation of chain and ring structures upon combining chalcogen elements to form chalcogenide materials and the lone pair electrons provide a source of electrons for forming a conducting filament. Trivalent and tetravalent modifiers such as Al, Ga, In, Ge, Sn, Si, P, As and Sb enter the chain and ring structures of chalcogen elements and provide points for branching and crosslinking. The structural rigidity of chalcogenide materials depends on the extent of crosslinking and leads to a broad classification of chalcogenide materials, according to their ability to undergo crystallization or other structural rearrangements, into one of two types: threshold materials and memory materials.

Both types of chalcogenide materials display the switching behavior shown in FIG. 1, but differ in their structural response to filament formation. Threshold materials generally possess a higher concentration of modifiers and are more highly crosslinked than memory materials. They are accordingly more rigid structurally. Threshold materials are amorphous and show little or no tendency to crystallize because the atomic rearrangements required to nucleate and grow a crystalline phase are inhibited due to the rigidity of the structure. The structural rigidity also aids in reducing leakage currents. Threshold materials remain amorphous upon removing the applied voltage after switching.

Memory materials, on the contrary, are more lightly crosslinked and more easily undergo full or partial crystallization. An amorphous memory material undergoes filament formation in the presence of a threshold voltage as described in FIG. 1 hereinabove. Once in the conductive branch, however, the memory material may undergo nucleation and growth of a crystalline phase. The volume fraction of the crystalline phase depends on the magnitude and time of the current passing through the memory material. The crystalline phase is retained upon removing the applied voltage after switching. Through appropriate selection of device operating conditions, the amorphous-crystalline transformation of chalcogenide memory materials becomes reversible over many cycles. Chalcogenide memory materials have been discussed in U.S. Pat. Nos. 5,166,758; 5,296,716; 5,534,711; 5,536,947; 5,596,522; and 6,087,674; the disclosures of which are hereby incorporated by reference.

The instant devices improve upon the prior art two-terminal devices by providing multi-terminal devices with which it is possible to control the operating conditions required to induce switching and filament formation in a desired location within a chalcogenide material, by providing devices that permit operation at otherwise inaccessible currents below the holding current, and by providing devices that exhibit gain or amplification of current. Some embodiments of the instant devices include one or more input terminals, one or more output terminals, and one or more control terminals in electrical communication with a chalcogenide material. In the instant devices, a suitable control signal at the control terminal influences the conductivity, threshold switching voltage or gain factor of the chalcogenide material between a first terminal of the device and a second terminal of the device. In the absence of a control signal, the chalcogenide material switches from a resistive state to a conductive state upon application of a threshold voltage, where the magnitude of the threshold voltage corresponds to the threshold voltage between the first and second terminals in the corresponding two-terminal device configuration. The presence of a suitable control signal at the control terminal of the instant multiterminal devices permits modulation of the threshold voltage between the first and second terminals to a magnitude different from that obtained in the corresponding two-terminal device configuration. Also, when a sub-threshold voltage is applied between a first terminal and a second terminal of the instant devices, application of a control signal may vary the conductivity of the chalcogenide material between the two terminals by inducing a transformation of the chalcogenide material from a resistive state to a conductive state. As a result, high conductivity may be achieved between one terminal and another terminal even when the voltage applied between the two terminals is below the threshold voltage of the corresponding two terminal device. In these embodiments, the control signal may be an electrical signal such as a current or voltage.

In other embodiments of the instant invention, the control signal is an optical signal. Devices according to these embodiments include a first terminal and a second terminal in electrical communication with a chalcogenide material, wherein an optical control signal provided by an optical source is used to control the conductivity or threshold voltage of the chalcogenide material between the first and second terminals. The optical control signal provides energy to the chalcogenide material and may be applied to selected portions of the chalcogenide material or to the whole of the chalcogenide material. Suitable optical sources include incandescent lights, lasers, diodes, light provided by optical fibers or waveguides or light provided by optical chalcogenide materials, including those that contain Se. Optical sources operating in continuous mode or pulsed mode are within the scope of the instant invention.

In other embodiments, the instant devices provide for a gain or amplification of current in a chalcogenide device having three or more terminals. In these embodiments, a voltage is applied between a first terminal and second terminal of the device and is maintained at a level below the threshold voltage. While maintaining the subthreshold voltage, a control signal (e.g. voltage) is applied to a third terminal of the device to produce or maintain a subthreshold current flow between the first and second terminals. The control signal further establishes a flow of current to/from one of the first and second terminals from/to the third terminal. Once a current is established with the third terminal, subsequent variation of the signal applied to the third terminal may produce gain or amplification of the current between the first and second terminals. In one embodiment, the third terminal injects current carriers that contributes to the current flowing between the first and second terminals. The net effect of this embodiment is achievement of a multiterminal chalcogenide device that has transistor-like functionality. Operation of a chalcogenide device so as to achieve transistor-like functionality may be referred to herein as a gain or transistor mode of operation. In one embodiment, the device can be operated in gain mode between one pair of terminals. In another embodiment, the device can be operated in switching mode between another or the same pair of terminals. In yet another embodiment, the device can be operated in gain mode between one pair of terminals and switching mode between another pair of terminals.

Figure 2:
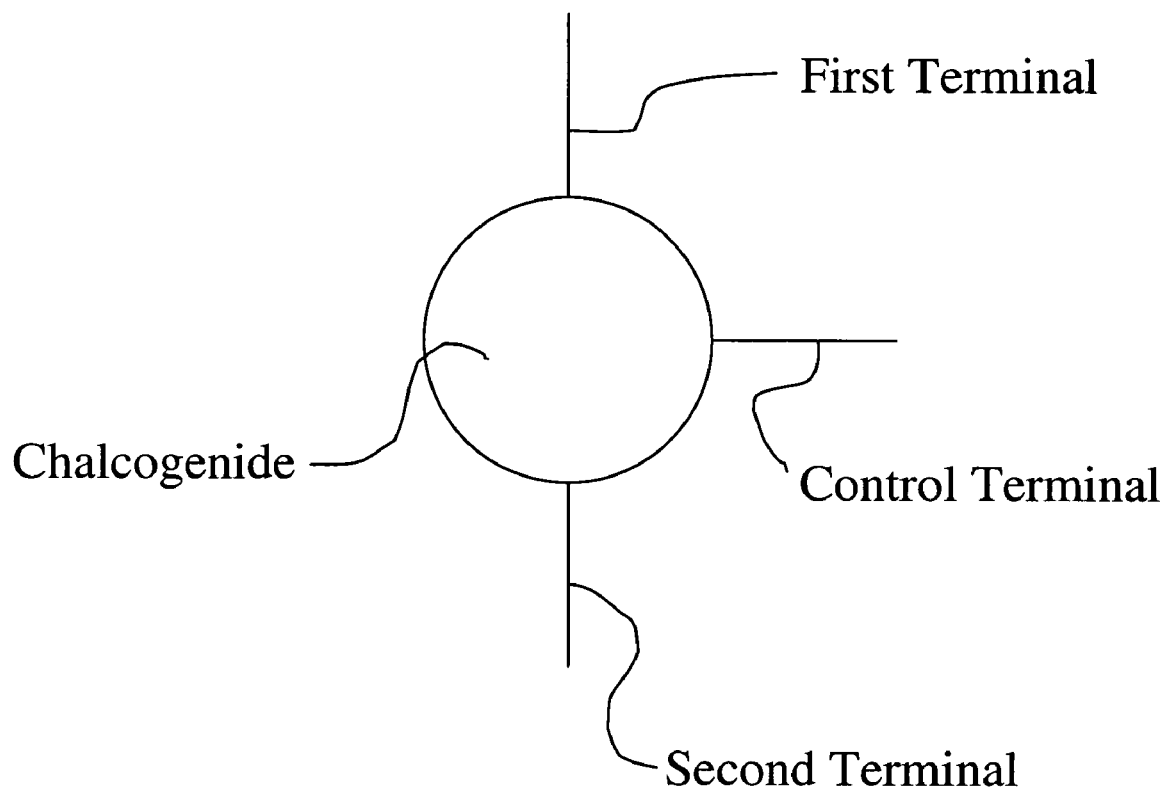
FIG. 2. Schematic depiction of a generic three-terminal chalcogenide device according to the instant invention.

One embodiment of the instant devices is a three terminal device having a first terminal, a second terminal and a control terminal in electrical communication with a chalcogenide material. A schematic depiction of this embodiment is presented in FIG. 2. In this embodiment, the control terminal may be used to modulate the conductivity of the chalcogenide material between the first and second terminals or to modulate the threshold voltage that must be applied between the first and second terminals to induce a transformation of the chalcogenide material from a resistive state to a conductive state. The first and second terminals may also be referred to herein as non-control terminals, input and/or output terminals, or load and reference terminals. Terminals may also be referred to as electrodes and may include terminals containing a single layer or chemical composition as well as terminals comprising two or more layers.

Another embodiment of the instant devices is a three terminal device having a first terminal, a second terminal and a control terminal in electrical communication with a chalcogenide material. In this embodiment, the control terminal may be used to create or modulate the gain or amplification of current flow through the chalcogenide material between the control terminal and one of the first and second terminals or between the first and second terminals. In a preferred embodiment, the structure of the device includes an upper or top terminal, a lower or bottom terminal and an intermediate terminal positioned or spacedly disposed between the upper and lower terminals, where the intermediate contact serves as the control terminal. In another preferred embodiment, the control terminal is spatially positioned closer to one of the upper or lower terminals and a signal applied to the control terminal or between the control terminal and the closer of the upper or lower terminals produces a gain or amplification of the current passing between another pair of terminals of the device.

Embodiments of the instant invention include devices having a structure in which one terminal is spacedly disposed between two other terminals, where the spacedly disposed terminal is located in closer proximity to one of the two terminals between which it is positioned. Such embodiments may be referred to herein as asymmetric device structures to signify an asymmetric positioning of the spacedly disposed terminal. In a preferred embodiment, the spacedly terminal is a control terminal. Devices in which the spacedly disposed terminal is equally situated between two other terminals may be referred to herein as symmetric devices.

Other embodiments of the instant invention include those in which the chalcogenide material, although switchable in principle, may not be switched between a pair of terminals of a multi-terminal device. In a preferred embodiment, the spatial separation between a pair of terminals is kept sufficiently small to inhibit or prevent switching of the chalcogenide material. While not wishing to be bound by theory, the instant inventor believes that through control of the spatial separation between terminals, it become possible to control the characteristics of the switching transition as well as the electrical state of the chalcogenide material. Upon application of a signal at a terminal, it is believed that an electric field develops at the interface between the terminal and the adjacent chalcogenide material and that this electric field extends into and influences the characteristics of the chalcogenide material. The occupancy of traps or surface defect states of the chalcogenide material at or adjacent to its interface with the terminal, for example, may be influenced by the electric field. Upon application of a signal at a terminal, a space-charge region may be established adjacent to the terminal in which the electric field or other electrical effect produced at the terminal influences the state of charge, occupancy of traps or defect states within the chalcogenide material and/or the distribution of charges within the chalcogenide material. The region within the chalcogenide material over which these effects extends may be referred to herein as a space-charge region. The spatial extent of the space-charge region within the chalcogenide material may depend on factors such as the quality of the interface, composition of the chalcogenide material, choice of electrode material, and nature or magnitude of the signal applied to the terminal.

When neighboring terminals are sufficiently far apart spatially, their respective space-charge regions do not overlap and a switching transformation can be effected as described hereinabove between the terminals. As the spatial separation between terminals decreases, however, it becomes possible for the space-charge regions of neighboring terminals to perceive or otherwise influence each other. At sufficiently small separations, the space-charge regions may even overlap spatially.

Different regimes of device operation may be envisioned based on the mutual interactions of the space-charge regions emanating from or established adjacent to different terminals. In one regime, the terminals are sufficiently separated to prevent significant interactions between the space-charge regions of neighboring terminals. This regime is believed to correspond to the conventional chalcogenide switching devices. In a second regime, at least one pair of terminals is sufficiently close together to enable their space-charge regions to interact. The interaction may be coulombic or electrical in nature and may be based on well-known interactions between electric or charge fields in general. Such interactions may be repulsive or attractive in character. Quantum interactions, such as tunneling, may occur between space-charge regions of neighboring terminals in this regime if the space-charge regions are sufficiently close together. The space-charge regions emanating from neighboring terminals may, for example, extend 60 Å. If the terminals are spaced 125 Å apart, the space-charge regions do not overlap, but they are nonetheless close enough together (5 Å between the outer boundaries) that tunneling, exchange or other quantum effects may occur. In a third regime, at least one pair of terminals is sufficiently close together to enable their space-charge regions to spatially overlap. It is to be noted that for a given (or fixed) spatial separation of terminals, the magnitude of signals (e.g. voltages or currents) applied to the different terminals may influence the regime in which the device operates so that for a particular device structure, operation in one or more regimes may be possible depending on the nature or strength of the applied signals.

In customary terms, it is believed that chalcogenide switching devices may reside either in a resistive state or a conductive state and that the intervening electrical or physical states that bridge the conductive and resistive states are transitory and fleeting and incapable of being stabilized or otherwise harnessed for beneficial effect. The instant inventor believes that this view is most closely associated with the first of the three regimes described above, the regime in which no significant interaction is present between the space-charge regions of neighboring terminals during device operation. In this regime, the presence of a space-charge region at one terminal does not materially affect the characteristics of the space-charge region at another terminal. As described in further detail in the EXAMPLES presented hereinbelow, by controlling the relative spatial positions of the terminals, the instant inventor has enabled interactions between space-charge regions of neighboring terminals during device operation and new operational features, including gain and reversible modulation of currents at levels below the holding current and/or threshold current, have been achieved for the first time as a result. By controlling the relative proximities of space-charge regions and inducing interactions between the space-charge regions, it becomes possible to alter the conventional processes associated with creating a filament and controlling the conductivity of a chalcogenide material to achieve new functionality. Rich new physics is achieved.

In some embodiments of the instant invention, the electrical communication between a terminal and the chalcogenide material of the instant devices is direct, whereby an electric current propagates from the terminal to the chalcogenide material. A terminal that influences the chalcogenide material directly may be referred to herein as a direct terminal or direct contact. In one embodiment, a direct terminal may inject charge carriers (e.g. electrons, holes). In other embodiments of the instant invention, the electrical communication between a terminal and the chalcogenide material of the instant devices is indirect, whereby an electrical effect at the terminal (such as a potential, charge accumulation or electric field) influences the chalcogenide material without passage of an electrical current. A terminal that influences the chalcogenide material indirectly may be referred to herein as a field effect terminal or a field effect contact. In other embodiments, a terminal may influence the chalcogenide material through a magnetic or electromagnetic interaction.

In one embodiment, a terminal includes a conductive material in contact with a barrier material where the barrier material is in contact with the chalcogenide material of the device. In another embodiment, a terminal includes a conductive material and a barrier material where electrical communication between the conductive material and chalcogenide material occurs, through the barrier material. In still another embodiment, a terminal includes a chalcogenide material disposed between two conductive materials where one of the conductive materials is in electrical communication with the working chalcogenide material of the instant devices. In this embodiment, the terminal may be a two-terminal chalcogenide device, such as an Ovonic Threshold Switch, where the conductivity of the terminal is controlled by the resistivity of the chalcogenide material included in the terminal. A memory type chalcogenide material may also be used. In these embodiments, the terminal can be resistive or conductive and thereby control access of a control signal or input signals to the working chalcogenide of the instant devices. In yet another embodiment, a terminal may be a field effect electrode that includes a thin dielectric layer interposed between a conductive material and the working chalcogenide. Principle of operation of such an electrode is similar to that of a gate electrode in a MOSFET. The dielectric layer inhibits the flow of current from the conductive material to the working chalcogenide, but is sufficiently thin to allow electric fields present in the conductive material to influence the chalcogenide material.

Analogous embodiments having more than three terminals are also within the scope of the instant invention. In these embodiments, devices having a plurality of input, output and/or control terminals are within the scope of the instant invention. Preferred embodiments of the instant invention are those in which different terminals are electrically isolated from one another in the sense that electrical communication or signal transmission between any pair of terminals occurs through the chalcogenide material. Electrical communication and signal transmission include the communication or transmission of electrical effects such as charges, currents or voltages. Electrical isolation may occur, for example, by separating electrodes with an insulating material or by otherwise spacedly disposing the electrodes. The instant invention includes embodiments in which three or more terminals in electrical communication with a chalcogenide material are arranged in a planar configuration as well as embodiments in which the terminals are arranged in a non-planar configuration.

In U.S. Pat. Nos. 6,967,344 and 6,969,867, the disclosures of which are incorporated by reference herein, the instant inventors described three-terminal chalcogenide devices having a control terminal capable of injecting current into a chalcogenide pore region interposed between an upper and lower contact. Embodiments demonstrating injection through direct and indirect (field effect) means were disclosed. The patents further demonstrated that application of a suitable electrical signal at the control terminal permitted modulation of the threshold voltage of a chalcogenide switching material. Notably, it was shown that the presence of a voltage or other electrical signal at the control terminal could reduce the voltage required to trigger a switching event between the upper and lower contacts.

Similar injection and modulation effects are among the features of the instant devices, as will be described in the Examples presented hereinbelow. The instant devices further provide for a gain or amplification of current as well as a reversibility in the ability to modulate the threshold voltage of a chalcogenide switching material. As will be described in some of the Examples hereinbelow, the instant devices include a structural arrangement or positioning of the control terminal relative to the top or bottom terminal that provides for a subthreshold mode of operation that inhibits a chalcogenide switching device from latching into its ON state from its OFF state when a signal is applied at the control terminal. By avoiding latching, the device can be maintained in the OFF state and the effects of applying a signal at the control terminal becomes reversible. The threshold voltage, for example, required to effect a switching event between the top and bottom contacts can be reversibly modulated simply by varying the magnitude of the signal applied to the control terminal. Since the device does not latch in the subthreshold mode of operation, it is not necessary to relax the device from its ON state back to its OFF state in order to modulate the threshold voltage.

Embodiments of the instant invention include devices having structures in which the control terminal is spacedly disposed between the upper and lower terminals and is located in closer spatial proximity to the lower terminal or contact than to the upper terminal or contact. Other embodiments of the instant invention include devices having structures in which the control terminal is located in closer spatial proximity to the upper terminal or contact than to the lower terminal or contact. The device structures of these embodiments may be referred to herein as asymmetric devices structures to signify the fact that the control terminal is not equally spaced between the upper and lower contacts. The asymmetric device structure may facilitate subthreshold operation of a chalcogenide device and leads to the beneficial gain and reversibility effects described herein.

Another embodiment of the instant invention includes chalcogenide electronic devices having three or more terminals where application of a time-varying signal to one of the terminals reversibly modulates the current, current density, conductivity, and/or threshold voltage of the chalcogenide material between a pair of terminals of the device.

Another embodiment includes chalcogenide electronic devices having three or more terminals where the device can simultaneously or sequentially transmit currents between two or more pairs of terminals without switching or transforming from a resistive state to a conductive state.

Another embodiment includes chalcogenide electronic devices having three or more terminals where it is possible to switch the chalcogenide material between one pair of terminals from a resistive state to a conductive state, but where the chalcogenide material cannot be switched from a resistive state to a conductive state between a different pair of terminals.

Another embodiment includes chalcogenide electronic devices having three or more terminals where the terminals are arranged in an asymmetric configuration in which one terminal is spacedly disposed between two other terminals and is located in closer spatial proximity to one of the two surrounding terminals than to the other of the two surrounding terminals.

EXAMPLE 1

Figure 3:
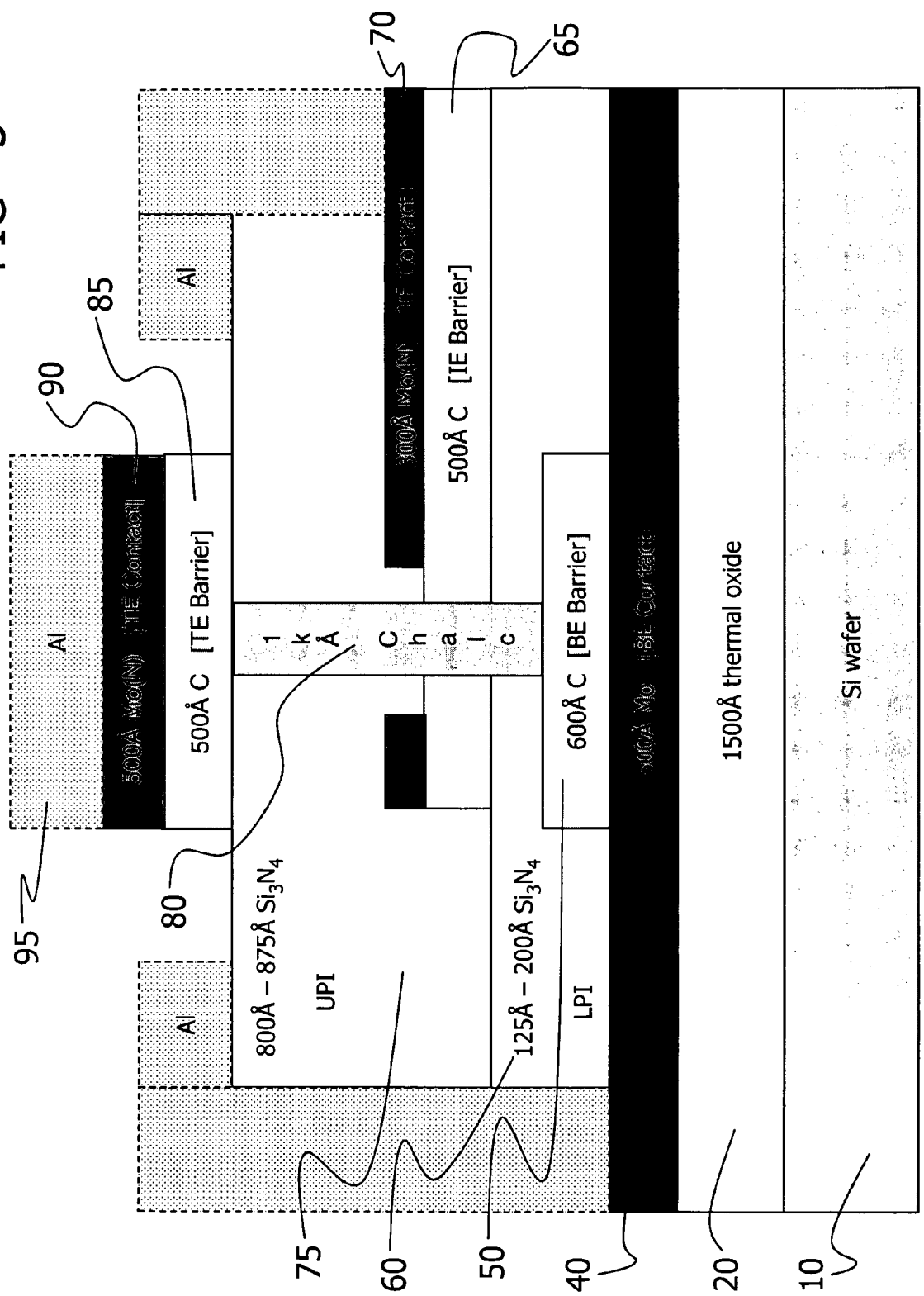
FIG. 3. Schematic depiction of an embodiment of a three-terminal chalcogenide device according to the instant invention.

An example of a device structure according to the instant invention is shown in FIG. 3. FIG. 3 shows a cross-sectional view of a three terminal device structure. A plurality of these devices was formed on a silicon wafer. The devices and layers on the wafer were formed using conventional sputter deposition, etching, and lithography techniques. The structure includes a silicon wafer substrate 10, a silicon oxide layer 20, a bottom terminal that includes a conductive layer 40 formed from Mo and a carbon layer 50, a lower $Si_3N_4$ insulating region 60, a control terminal that includes a carbon layer 65 and a Mo layer 70, an upper $Si_3N_4$ insulating layer 75, a chalcogenide material 80 contained in the pore region of the device, a top terminal that includes a carbon layer 85 and a conductive layer 90 that includes Mo, and Al layers 95. In this example, the chalcogenide material 80 is an Se—Te chalcogenide alloy having an approximate composition $Si_5Ge_{11}As_{28}Te_{34}Se_{21}S$. Typical layer thicknesses are indicated in FIG. 3. The region occupied by the chalcogenide material in device of this example is cylindrical with a height of approximately 0.1 micron. The region occupied by the chalcogenide material may be referred to herein as a pore, pore region or the like. The upper, lower, and control terminals are in electrical communication with the chalcogenide and correspond to the terminals indicated in the depiction of FIG. 2. Carbon layer 65 of the control terminal circumscribes the chalcogenide material 80. The top terminal and bottom terminal may also be referred to as the load and reference terminals, respectively. In a preferred embodiment, the reference terminal is at ground. The terminals are separated by insulating material so that electrical communication between electrodes occurs through the chalcogenide material.

The device depicted in FIG. 3 may be referred to herein as an asymmetric device because of the asymmetry in the position of the control terminal 70 relative to the top terminal 90 and bottom terminal 30. More specifically, the thicknesses of the insulating layers 60 and 65 are such that the control terminal 70 is located in closer spatial proximity to bottom terminal 30 than to top terminal 90. The asymmetric placement of the control terminal 70 facilitates the operation of the device in a subthreshold mode as well as operation of the device without latching. The control terminal 70 is spacedly disposed between bottom terminal 30 and top terminal 90. The separation between the control terminal 70 and bottom terminal 30 is believed to be sufficiently close to permit an overlap or interaction of space-charge regions emanating from the terminals.

EXAMPLE 2

In this example, a device having a symmetric design was fabricated according to the process described in EXAMPLE 1 hereinabove. In the symmetric design, the upper insulating layer 75 and lower insulating layer 60 both had a thickness of 500 Å, so that the control terminal 70 was positioned symmetrically between top terminal 90 and lower terminal 30. Other features of the symmetric device are as described in EXAMPLE 1. The separation between control terminal 70, top terminal 90 and lower terminal 30 is believed to be large enough to prevent a significant interaction between the space-charge regions emanating from the three terminals.

EXAMPLE 3

Figure 4:
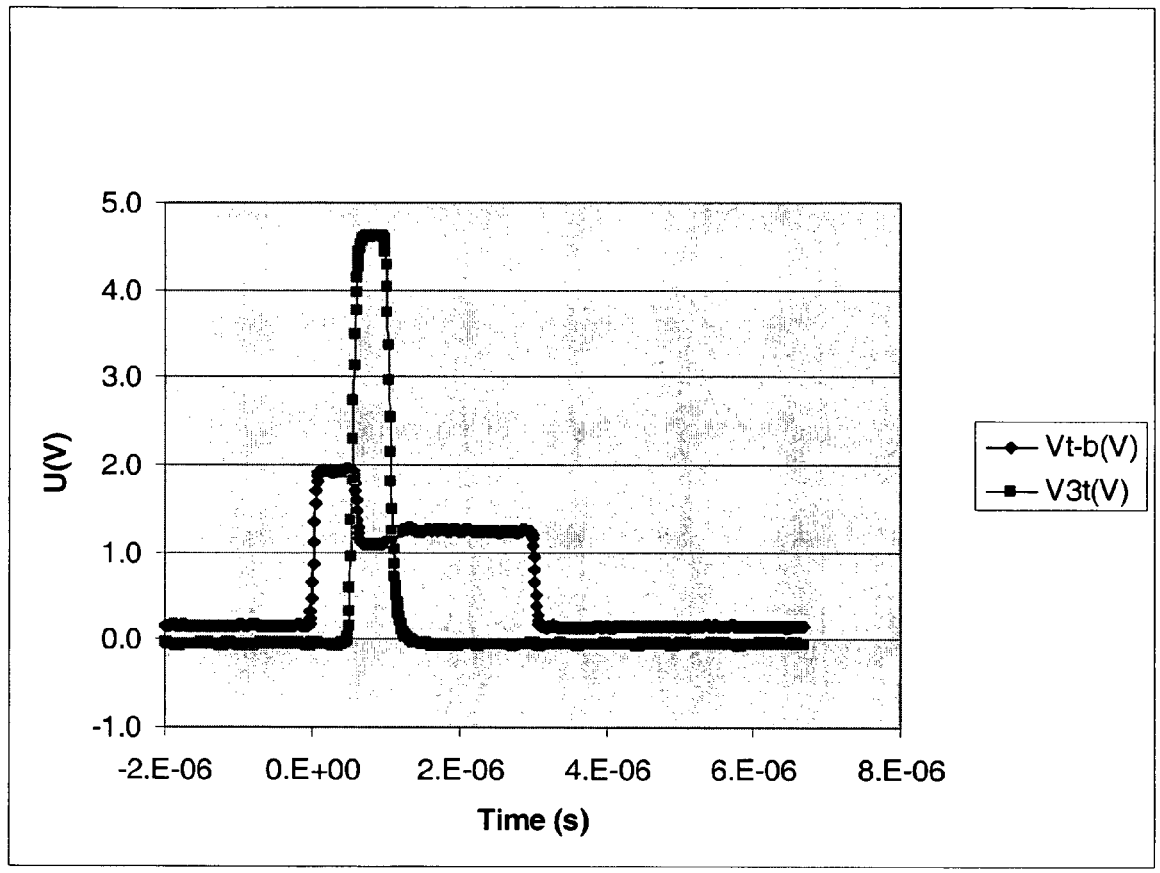
FIG. 4. Illustration of the latching mode of operation of a three-terminal chalcogenide device according to the instant invention.

In this example, a demonstration of the latching and non-latching modes of operation of the device described in EXAMPLE 1 is provided. An illustration of operation in latching mode is presented in FIG. 4, which shows the time variation of the voltage between the top and bottom terminals of the device before and after application of a voltage signal between the control terminal and bottom terminal. FIG. 4 includes two data curves: one, depicted in diamond symbols, that shows the voltage between the top and bottom terminals as a function of time and another, depicted in square symbols, that shows the voltage between the control and bottom terminals as a function of time. At the outset of the experiment, a signal of approximately 2V was applied between the top and bottom terminals and no signal was applied between the control terminal and the bottom terminal. The signal applied between the top and bottom terminals was an insufficient voltage to cause a switching event to occur. While the signal was maintained between the top and bottom terminals, a control signal of about 4.5V was applied between the control terminal and bottom terminal. Upon application of the control signal, the voltage between the top and bottom terminals was observed to drop to a level of slightly above 1V. The voltage drop signifies the inducement of a switching event between the top and bottom terminals by the control signal in which the ON state of the chalcogenide material is established. Upon removal of the control signal, the data shown in FIG. 4 indicate that the device remained in its ON state as the voltage between the top and bottom terminals remained at approximately the same value as existed while the control signal was applied. The removal of the control signal from the control terminal did not cause the device to relax from its ON state. The device remained in its ON state and the current passing between the top and bottom terminals remained at or above the holding current. This behavior demonstrates the latching capability of the instant device.

Figure 5:
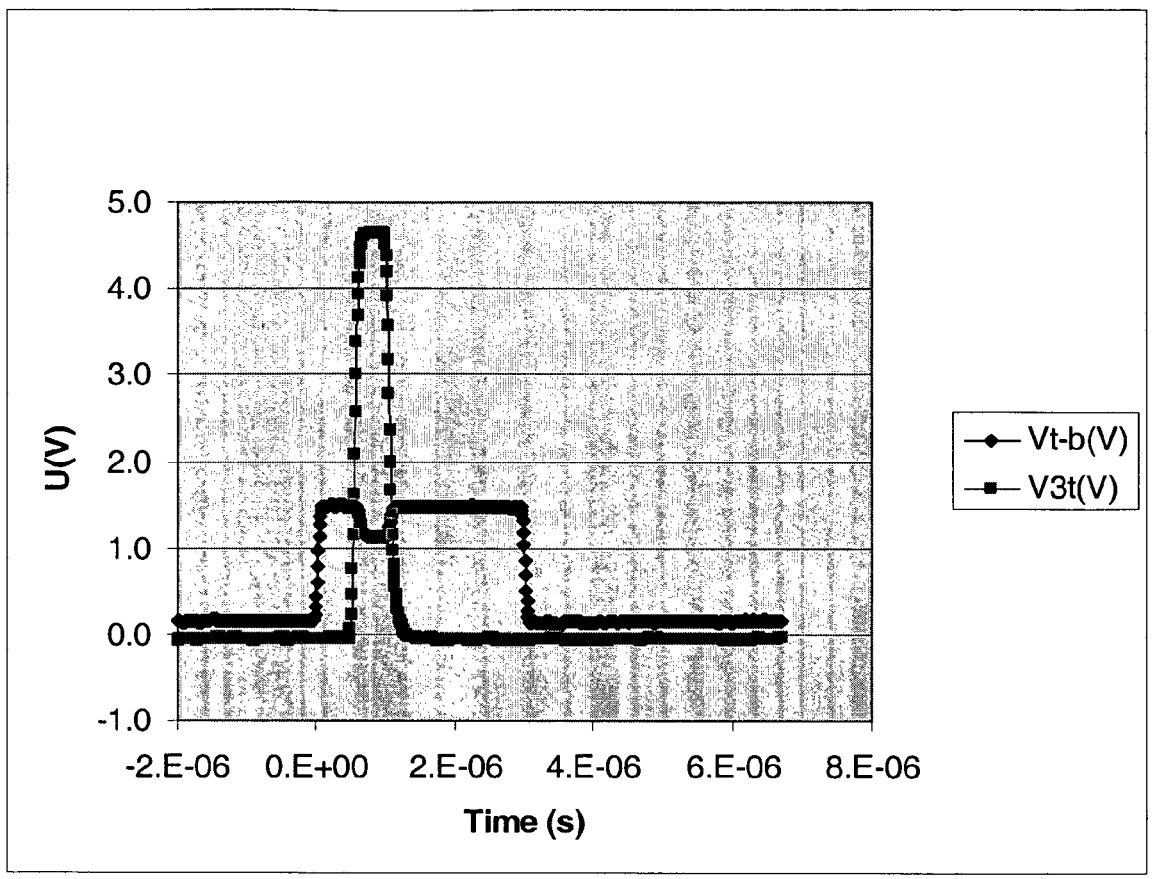
FIG. 5. Illustration of the non-latching mode of operation of a three-terminal chalcogenide device according to the instant invention.

Results of a second experiment are shown in FIG. 5, which illustrates the non-latching mode of operation of the instant device. In this experiment, the initial voltage between the top and bottom terminals was set to a value of about 1.5V before the control signal of about 4.5V was applied to the control terminal. Upon application of the control signal, a decrease in the voltage between the top and bottom terminals to a level of slightly above 1V was observed, indicating a transformation (which need not involve a switching event) to a more conductive state. The voltage between the top and bottom terminals remained low for the duration of the control signal. In contrast to the results shown in FIG. 4, when the control signal was removed, the voltage between the top and bottom terminals returned to its initial value. This result indicates that the control signal is able to transitorily create an ON state or ON-type state (e.g. a state having some, but not all of the characteristics of an ON state, including, for example, conductivity greater than that of the resistive state) for the device, but that the state can be terminated by removing the control signal. This result demonstrates the non-latching mode of operation of the instant device. In the non-latching mode, application of a control signal can transform the chalcogenide material to an ON-like state, but the ON-like state is unstable and destroyed when the control signal is removed. This indicates that the ON-like state created in non-latching mode exists with a current below the holding current of the chalcogenide material between the top and bottom terminals. Application of the control signal creates a conductive state (which likely includes a filamentary solid state plasma or a precursor thereto) while not producing a current that exceeds the holding current. The control signal injects some degree of current, but not enough current for the chalcogenide material to stabilize the device in an ON-like state in the absence of the control signal.

EXAMPLE 4

In this example, the results of various I-V measurements of the asymmetric three terminal device described in Example 1 are described. The measurements were completed on several different devices selected randomly from the devices formed on a wafer and representative results are discussed in this example. The measurements were obtained while operating the device in a subthreshold mode. In the subthreshold mode, the current between a pair of terminals (e.g. the top and bottom terminals or the control and bottom terminals) is limited to a magnitude below the holding current and/or threshold current. As used herein, a subthreshold current refers to a current that is below the holding or threshold current of the device. (See FIG. 1, the quantum regime, and the discussion thereof hereinabove.) When the applied current is below the holding current, the highly conductive solid state filamentary plasma is not stable and the device reverts back to its resistive or OFF state when the signal from the control terminal is removed. Measurements performed on the device described in Example 1 indicate that the holding current of the device is approximately 0.35 mA. In order to operate well below the holding current, a subthreshold current of approximately 1 µA was supplied between the top and bottom terminals during the course of the experiments described in this Example.

Figure 6:
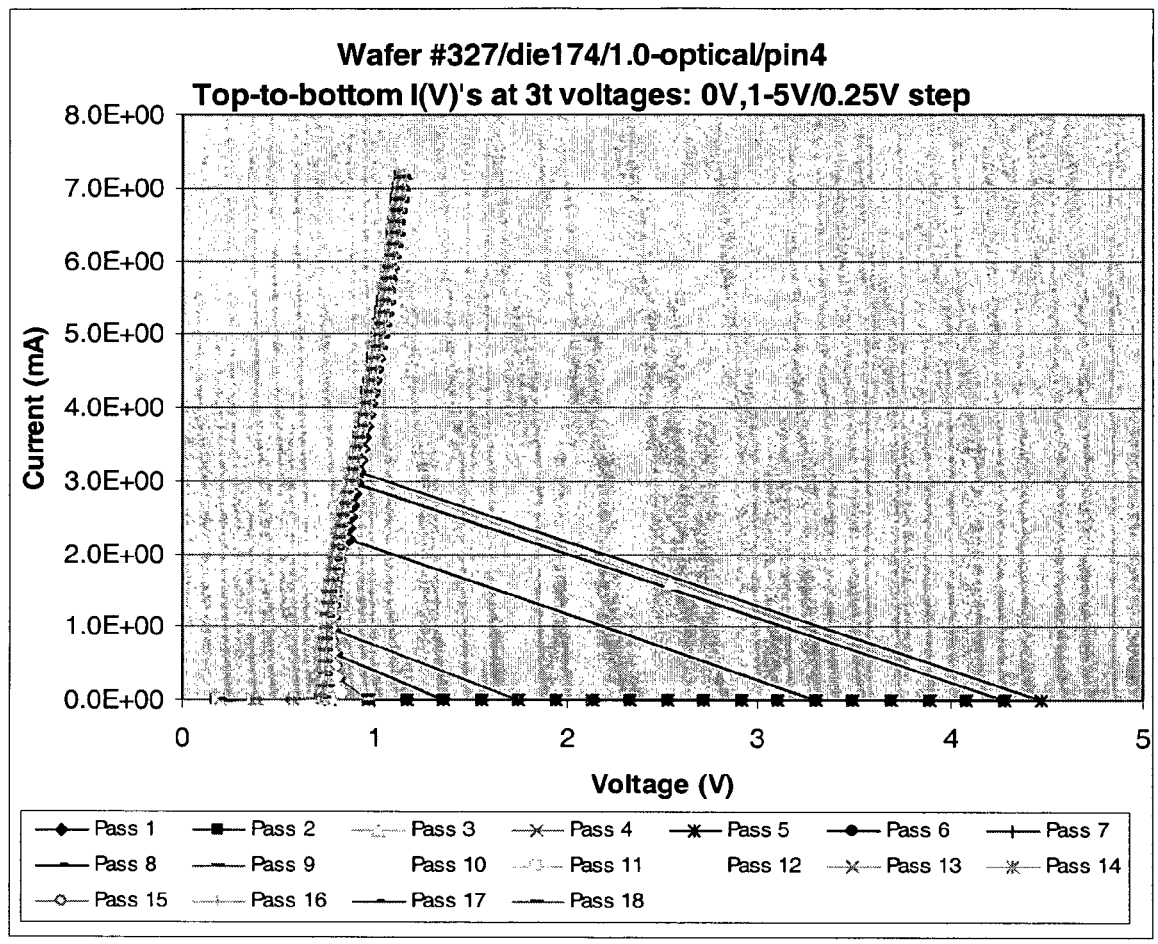
FIG. 6. I-V characteristics of the three-terminal device illustrated in FIG. 3 showing the switching characteristics of the device between the load and reference terminals as a function of the voltage applied to the control terminal.

FIG. 6 summarizes the results of selected I-V measurements completed by the instant inventor while operating the device in subthreshold mode. FIG. 6 shows the first quadrant of an I-V plot for the representative three terminal device described in Example 1. The current I corresponds to the current passing between the load (top) and reference (bottom) terminals of the structure and the voltage V depicted on the horizontal axis corresponds to the voltage applied between the top and bottom terminals. The I-V relationship between the top and bottom terminals was determined as a function of the control voltage applied to the control terminal. In the tests, a control voltage of constant magnitude was applied to the control terminal and the current between the load and reference terminals was measured as a function of the voltage applied between the top and bottom terminals. The control voltage was applied in the form of a long duration voltage pulse (e.g. 3 microseconds) and the voltage between the top and bottom terminals was applied in the form of a short duration pulse (e.g. 100 nanoseconds) while the control voltage was being applied. In this example, the control voltage is applied between the control terminal and reference terminal of the device.

The data in FIG. 6 indicate that application of a control voltage to the control terminal may be used to modulate the threshold voltage between the top and bottom terminals. The different I-V curves correspond to tests using different control voltages. Separate I-V curves were obtained for a control voltage of 0V (which was used to determine the holding current and holding voltage of the device) as well as for a series of control voltages, incremented in steps of 0.25V, between 1V and 5V. Representative results are shown in FIG. 6. The I-V curves illustrate the switching transition of the device and show that the threshold voltage that needs to be applied between the top and bottom terminals varies as the voltage applied to the control terminal varies. The data indicate that the threshold voltage can be varied from a value of above 4.5V to a value of below 1V by varying the control voltage. The test data presented in FIG. 6 demonstrate an ability to modulate the threshold voltage between two electrodes of a multi-terminal device by applying a control voltage to a control terminal. In addition to modulating the threshold voltage between two terminals, the instant multi-terminal devices may be used to modulate the conductivity of the chalcogenide material between two terminals through application of a control signal to the control terminal. The modulation of the current and threshold voltage between the top and bottom terminals are effects that illustrate functionality achievable in the instant multi-terminal devices that is not available in standard two-terminal devices.

Figure 7:
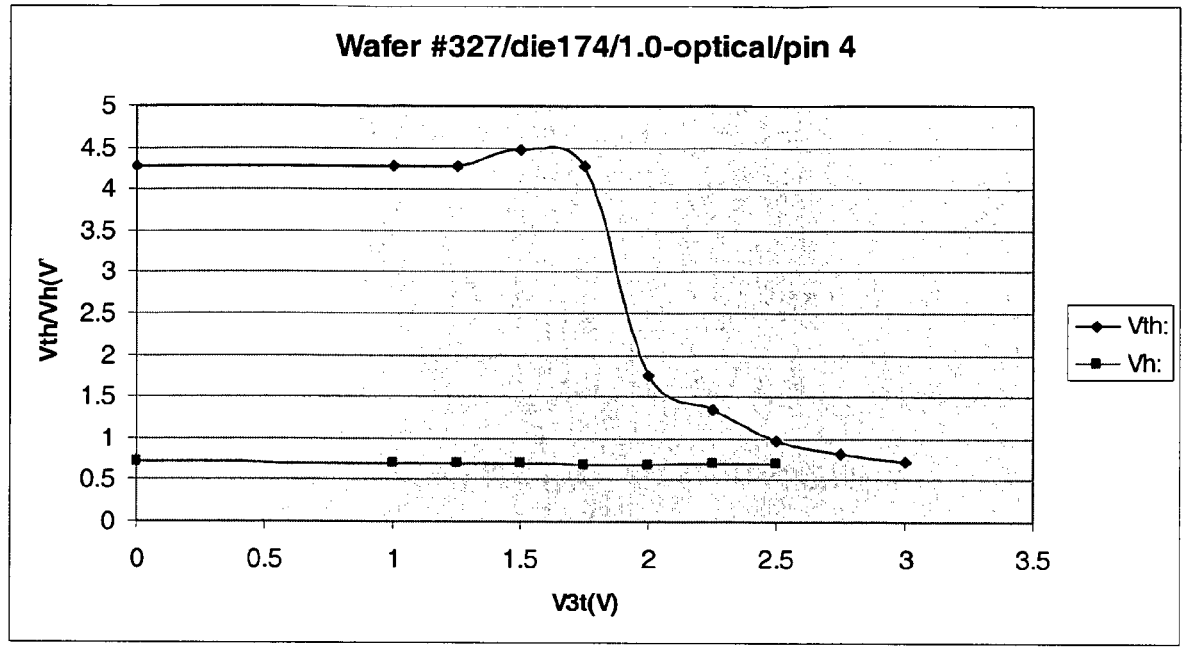
FIG. 7. Summary of the relationship between the threshold voltage and holding voltage of the device depicted in FIG. 6 as a function of the voltage applied to the control terminal.

FIG. 7 summarizes the results of the I-V experiments described in FIG. 6. FIG. 7 presents the threshold voltage and holding voltage between the top and bottom terminals as a function of the voltage applied to the control terminal. The threshold voltage is depicted with diamond symbols, designated as Vth and displayed as the upper curve in FIG. 7. The holding voltage is depicted with square symbols, designated as Vh, and displayed as the lower curve in FIG. 7. The signal applied to the control terminal was a voltage and is designated as V3t in FIG. 7. The results indicate that while the holding voltage of the device remained approximately constant over the range of control voltages investigated, the threshold voltage exhibited a significant dependence on the control voltage. The threshold voltage remained at about 4.5V until the control voltage exceeded about 1.5V. Between control voltage of about 1.5V and about 2V, the threshold voltage exhibited a steep decrease. The threshold voltage continued to decrease for control voltages above 2V.

A noteworthy feature of the result depicted in FIG. 7 is the reversibility of the variation in the threshold voltage (and the accompanying variations in the conductivity and current) of the chalcogenide material of the device. When the signal applied to the control terminal is increased from a low value to a high value, the threshold voltage decreases and when the signal applied to the control terminal is decreased from a high value to a low value, the threshold voltage increases. The increase and decrease in threshold voltage can be effected in real time and require no relaxation or other adjustment of the device configuration. When an oscillatory or other time-varying signal (e.g. AC, sinusoidal, modulated, chopped, intermittent, pulsed) is applied to the control terminal, an oscillatory or time-varying variation in the threshold voltage (and/or conductivity and/or current and/or current density and/or gain) of the chalcogenide material is produced. The reversibility of operation may also be referred to herein as bidirectional operation. Reversibility permits one to operate the device in the forward (left-to-right) and backward (right-to-left) directions along the V3t axis of FIG. 7. One can establish a particular operating point along Vth as a function of V3t curve of FIG. 7 and proceed either in the forward or backward directions to establish another operating point along the curve. Suitable variations in the signal applied to the control terminal permit one to transform the device from one operating state to another operating state on the Vth versus V3t curve.

In one embodiment, reversibility is a feature of the subthreshold mode of operation and/or the non-latching nature of the device while operated in the subthreshold mode. When a similar experiment is completed on a multiple terminal device that latches, the latching creates an ON state at or above the holding current that precludes operation of the device in the subthreshold mode. As a result, a latching device must be relaxed before a variation of the control signal manifests an effect on the operational characteristics of the device. Mere removal of the control signal from the control terminal does not suffice to relax the ON state of a latching device. While operation in latching mode can produce a curve similar to that shown in FIG. 7, the response is unidirectional. A signal applied to the control terminal can affect the threshold voltage between the load and reference terminals, but once the device latches, it remains in the ON state and is insensitive to subsequent variations in the signal applied to the control terminal until the chalcogenide material is allowed to relax back to the OFF state. Once the material relaxes, it becomes possible to establish a different threshold voltage by applying a different voltage to the control terminal. The symmetric device described in EXAMPLE 2 hereinabove exemplifies a device that latches and possesses the unidirectional characteristic described herein, as confirmed by experiments completed by the instant inventor.

EXAMPLE 5

Figure 8:
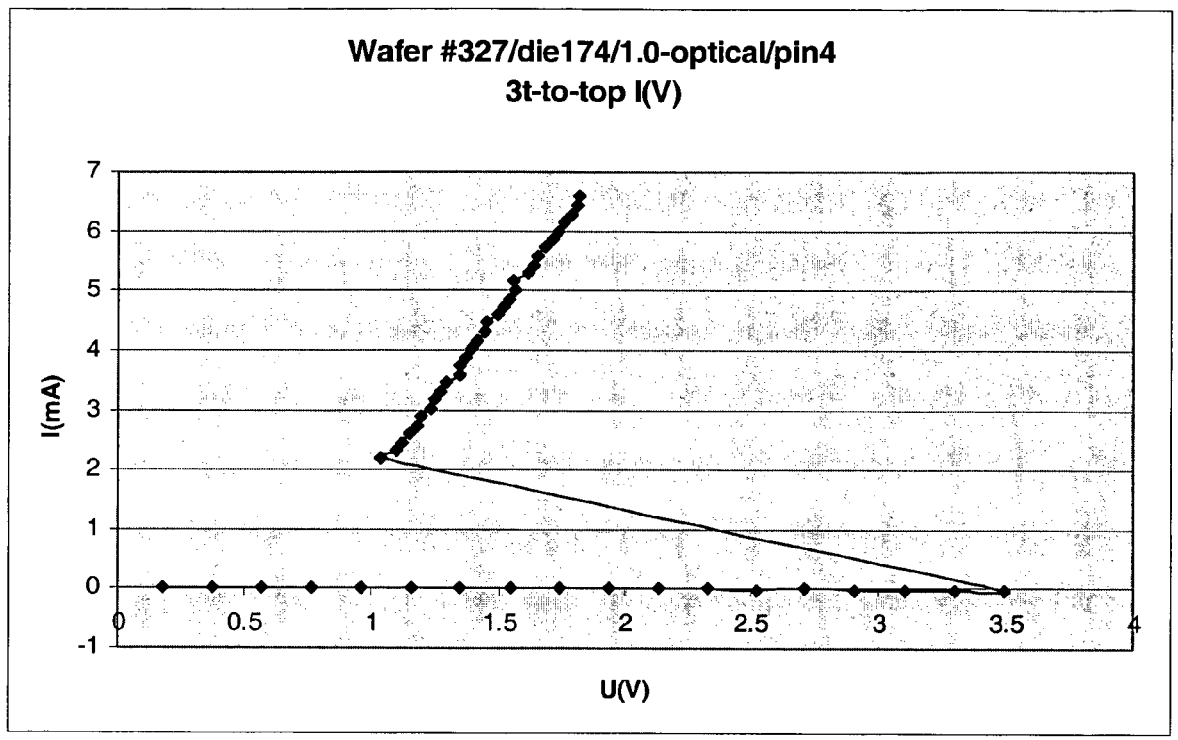
FIG. 8. I-V characteristics of the three-terminal device illustrated in FIG. 3 showing the switching characteristics of the device between the top (load) and control terminals as a function of the voltage applied to the control terminal.

FIG. 8 shows the I-V response between the top and control terminals of the device during operation in subthreshold mode by supplying a current of ~1 µA between the top and bottom terminals. The I-V response was measured by varying the voltage between the control terminal and the top terminal and measuring the current passing between the control terminal and the top terminal. FIG. 8 shows the relationship between the current measured between the control terminal and top terminal as a function of the voltage applied between the control terminal and top terminal. FIG. 8 indicates that a switching event occurred between the top and control terminals when the voltage applied therebetween reached about 3.5V. I-V measurements were also performed on the symmetric device described in EXAMPLE 2 hereinabove. I-V measurements between the top and control terminals of the symmetric device demonstrated that a switching event occurred in the symmetric device.

Figure 9:
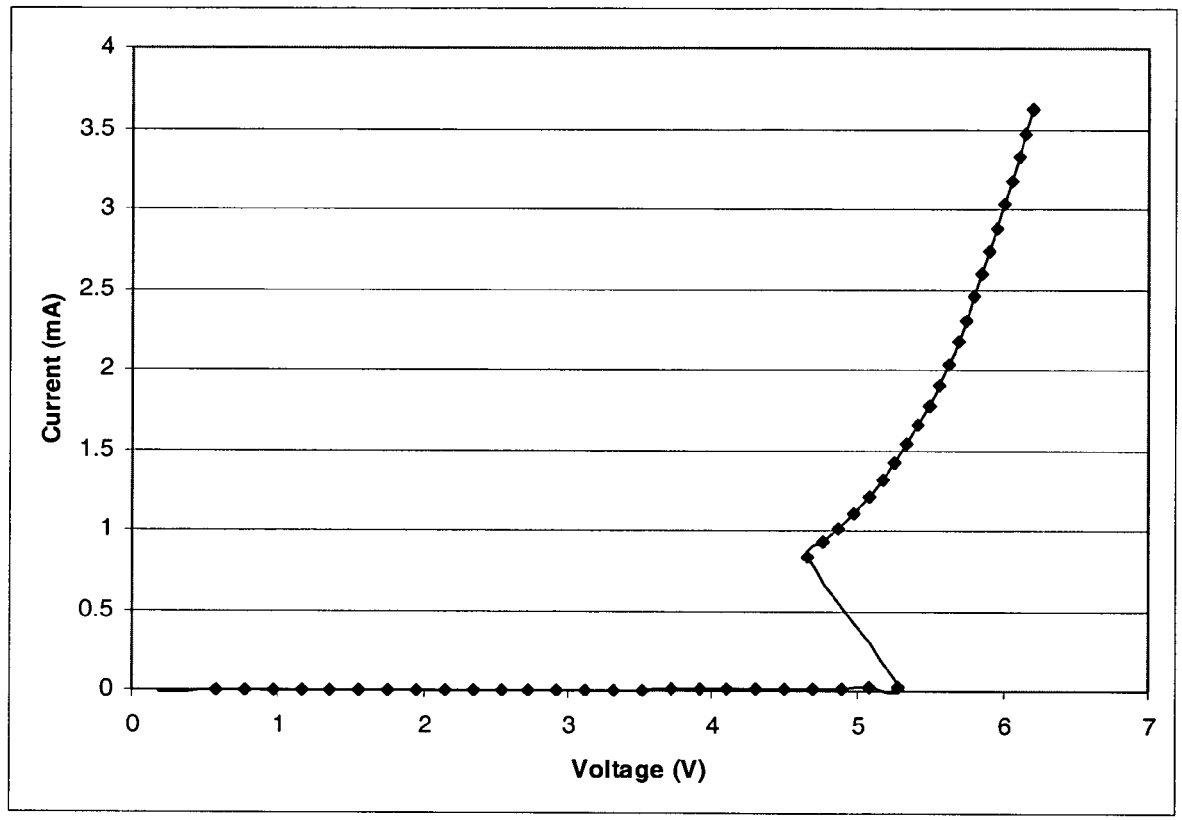
FIG. 9. I-V characteristics of a three-terminal device showing the I-V response of the device between the bottom (reference) and control terminals as a function of the voltage applied to the control terminal.

The I-V response was also measured between the control terminal and bottom terminal of both the symmetric device described in EXAMPLE 2 and the asymmetric device described in EXAMPLE 1. FIG. 9 shows the relationship between the current measured between the control terminal and bottom terminal as a function of the voltage applied between the control terminal and bottom terminal for the symmetric device. The I-V plot of the symmetric device shows a switching effect between control terminal and bottom terminal.

Figure 10:
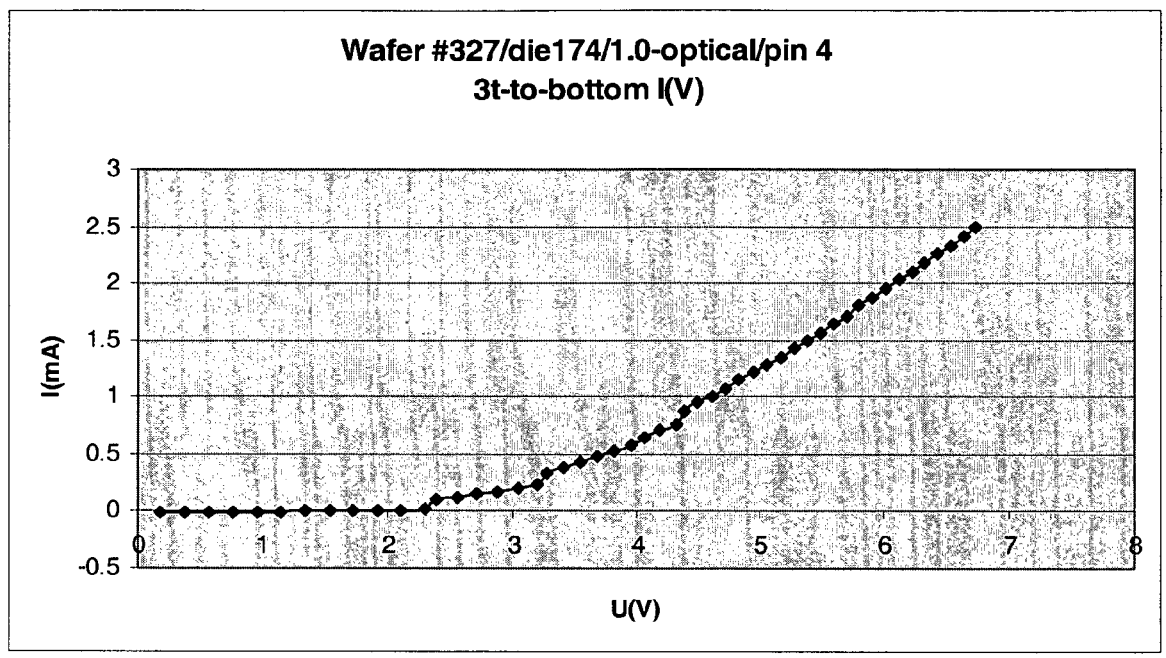
FIG. 10. I-V characteristics of the three-terminal device illustrated in FIG. 3 showing the I-V response of the device between the bottom (reference) and control terminals as a function of the voltage applied to the control terminal.

FIG. 10 shows the relationship between the current measured between the control terminal and bottom terminal as a function of the voltage applied between the control terminal and bottom terminal of the asymmetric device described in EXAMPLE 1. In contrast to the behavior observed for the control terminal and top terminal of the asymmetric device and the behavior observed between the control terminal and bottom terminal of the symmetric device, the I-V response measured between the control terminal and the bottom terminal of the asymmetric device showed no indication of a switching effect. Instead, a monotonic increase in current was observed as the voltage was increased (including at voltages above the voltages for which switching was observed between the top and bottom terminals or the top and control terminals of the asymmetric device). The device of this example is thus an embodiment of a device having at least three terminals for which switching can be induced between one pair of terminals (e.g. top and bottom terminals or top and control terminals), but not between another pair of terminals (e.g. control and bottom terminals).

The device of this example is also an embodiment of a device that permits simultaneous application of a signal (e.g. voltage or current) between a first pair of terminals (e.g. top and bottom terminals) and a signal between a second pair of terminals (e.g. control terminal and bottom terminal) without inducing latching or switching of the chalcogenide device. Embodiments of the device permit the simultaneous transmission of current between two or more pairs of terminals of a chalcogenide device having three or more terminals without inducing a transformation of the chalcogenide material from a resistive state to a conductive state. In other embodiments, the instant device permits sequential or pulsed transmission of current between two or more pairs of terminals of a chalcogenide device having three or more terminals without inducing a transformation of the chalcogenide material from a resistive state to a conductive state.

EXAMPLE 6

In this example, gain functionality of the device described in EXAMPLE 1 is described and demonstrated. A noteworthy aspect of the I-V characteristics depicted in FIG. 10 is the availability of a continuous range of currents between the control terminal and lower or bottom terminal. The currents available from the third terminal represent currents that may be injected into the device and the continuous range of currents depicted in FIG. 10 distinguishes the instant devices from conventional devices that show switching between the control terminal and bottom terminal because devices that exhibit switching necessarily exhibit a discontinuity in the range of currents available from the third terminal. In FIG. 9, for example, a discontinuous change along the current axis is readily apparent and there is a significant range of currents (from slightly above 0 A to the holding current (which is at or below about 0.8 A) that cannot be stabilized between the control terminal and bottom terminal because the voltages necessary to maintain currents in the range induce a switching of the material and a readjustment of the current and voltage to a point along the conductive branch. In FIG. 10, this limitation in current is not present and currents within the range of currents in the unavailable discontinuous range of FIG. 9 are permitted and may be used to operate the device. This range of currents corresponds generally to the quantum regime depicted in FIG. 1 and represents currents that extend below the holding current. In one embodiment, operation within the quantum regime is reversible and the device can be reversibly adjusted in current within the range of currents represented by the quantum regime. Currents below the holding current or the threshold current can be stabilized and reversibly increased or decreased through adjustment of the signal applied to the control terminal.

Figure 11:
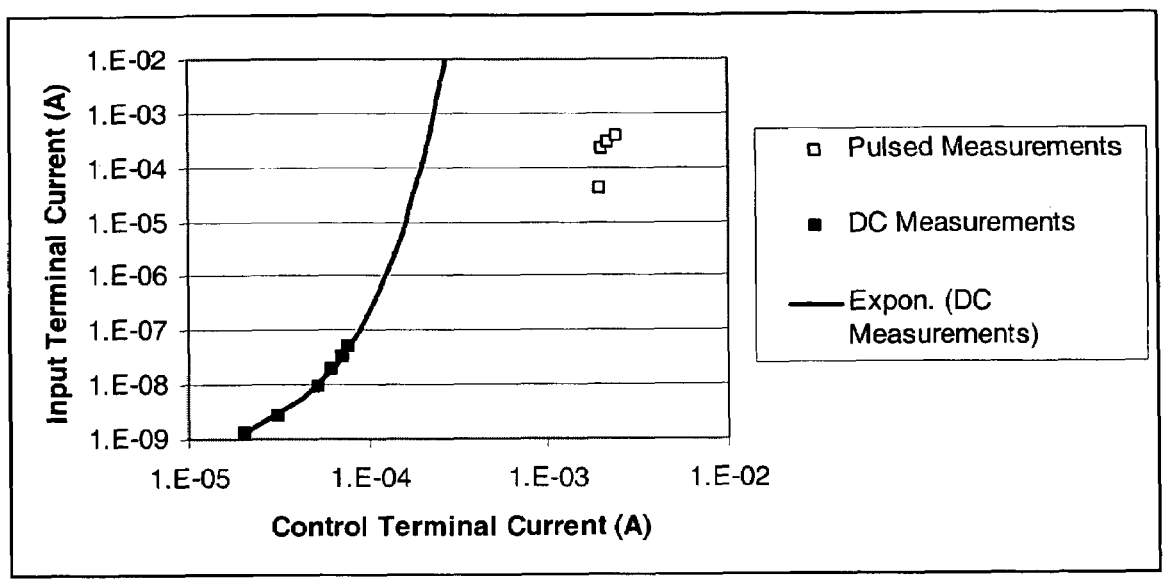
FIG. 11. Gain characteristics of the three-terminal device illustrated in FIG. 3 showing the current of the device between the top and bottom terminals as a function of the current between the control terminal and the bottom terminal.

In this example, we demonstrate one example of the new functionality obtained from operation in the quantum regime and specifically exploit currents from within this range to demonstrate gain in the instant devices. In this example, a voltage of 1V was applied and maintained between the top and bottom terminals of the device described in EXAMPLE 1 and a control signal was applied between the control terminal and the bottom terminal. Control signals of various magnitudes were applied between the control terminal and bottom terminal to establish a range of currents that would be unavailable if the chalcogenide material switched between the control terminal and bottom terminal. The variation of the current between the top and bottom terminals as a function of the current supplied between the control terminal and bottom terminal was measured. The results are summarized in FIG. 11, which includes data for two regimes of operation. The filled points represent data acquired while the device was operated in the subthreshold mode in which a current below the holding current was applied between the control terminal and the bottom terminal. These points also include a fit to the data that demonstrates an exponential dependence of the current passing between the top and bottom terminals on the current passing between the control and bottom terminals. The superlinear dependence indicates that the device provides gain. We note that in a conventional transistor, a superlinear increase in the current passing between the emitter and collection terminals is observed as the signal between the base and emitter terminals is increased. An extrapolation of the exponential dependence indicates that if the device is operated at higher current levels in the subthreshold regime, the device may be operated in a mode in which variation of a small current between the control terminal and the bottom terminal permits control of a large current between the top terminal and the bottom terminal. This operational capability is also a feature associated with gain. FIG. 11 also includes a set of data points depicted with unfilled symbols, which corresponds to operation of the device in the regime in which the signal supplied to the control terminal was sufficient to induce a switching transition between the top and bottom terminals. Thus, depending on the signal applied to the control terminal, the device can operate in a pre- or sub-threshold mode or a post-threshold mode.

This example illustrates a device having three or more terminals in electrical communication with a chalcogenide material in which the device exhibits gain.

Corresponding embodiments that include more than three terminals are also within the scope of the instant invention. In these embodiments, any terminal may function as a control terminal with respect to any two non-control terminals. Consider as an example a four-terminal chalcogenide device where the terminals are labelled 1, 2, 3, and 4. Terminal 1 may function as a control terminal for terminals 2 and 3, 2 and 4 or 3 and 4. Factors such as the relative proximity of terminal 1 to terminals 2, 3, and 4 and the voltages present at terminals 2, 3, and 4 influence the pair of terminals between which terminal 1 modulates the threshold voltage or conductivity of the chalcogenide material. If, for example, a voltage near the threshold voltage is present between terminals 2 and 3, while no voltage is present between terminals 2 and 4, a control signal provided by terminal 1 is more likely to modulate the threshold voltage or conductivity between terminals 2 and 3 rather than between terminals 2 and 4. Under suitable conditions, it may also be possible for terminal 1 to modulate the threshold voltage or conductivity of chalcogenide material between more than one pair of terminals within the group of terminals 2, 3, and 4. It may also be possible to provide control signals to two terminals. Control signals to terminals 1 and 2, for example, may modulate the threshold voltage, current, current density, gain or conductivity of chalcogenide material between terminals 3 and 4. Similarly, the relative spatial positioning of the terminals can provide the characteristics associated with subthreshold and/or non-latching operation as described hereinabove for any subset of three terminals. Analogous arguments hold for embodiments having more than four terminals.

Multi-terminal embodiments of the instant devices include devices having more than one control terminal and operating under the influence of more than one control signal. Multiple control signals may be electrical signals, optical signals or a combination of electrical and optical signals.

The terminals of the instant devices may be located in various spatial configurations. All terminals, for example, may be in a common plane or layer or two-dimensional circuit. Alternatively, one or more terminals may be positioned outside of a plane in which other terminals reside. A three terminal device according to the instant invention, for example, may have two terminals and a chalcogenide material in a common horizontal layer and a third terminal vertically disposed relative to that layer. Such a configuration provides for a vertical interconnection capability. Analogous embodiments for devices having more than three terminals are also within the scope of the instant invention.

The instant devices may be combined with other devices or elements to form circuits or networks. In one embodiment, the instant devices may be used as interconnection devices between two or more elements. In this embodiment, the conductivity of the chalcogenide material present in the instant device influences the electrical communication between two or more elements connected to the instant device. A schematic depiction of this embodiment is presented in FIG. 12 which shows a circuit or network element 200 coupled to a circuit or network element 210 through a three-terminal chalcogenide interconnection device 220. The interconnection device 220 includes interconnection terminals 230 and 240, control terminal 250 in electrical communication with chalcogenide material 260. The elements 200 and 210 may be single devices such as transistors, diodes, silicon devices, other chalcogenide devices or circuits or networks comprising a plurality of devices. One of the elements may also be a ground.

Application of a control-signal to the control terminal of the interconnection device 220 modulates the conductivity of the chalcogenide material between interconnection terminals 230 and 240, thereby providing a means for controlling the extent of electrical communication or signal transmission between elements 200 and 210. When the chalcogenide material 260 is in a resistive state, the conductivity of the interconnection device 220 is low and signal transmission from element 200 to element 210 (or vice versa) is poor or non-existent. The elements 200 and 210 are substantially electrically isolated from each other so that, for example, currents or voltages generated by one of the two elements is substantially not sensed by or substantially does not influence the behavior of the other of the two elements. When the chalcogenide material 260 is in a conductive state, the conductivity of the interconnection device 220 is high and signal transmission from element 200 to element 210 (or vice versa) is good. Electrical voltages or currents produced by one of the two elements are readily communicated to the other of the two elements.

As described hereinabove, the state of conductivity of the chalcogenide material 260 may be influenced by applying a suitable control signal to the control terminal 250. A control signal may induce a transformation of the chalcogenide material from a resistive state to a conductive state thereby enabling signal transmission and electrical communication between interconnected elements 200 and 210. The magnitude of the control signal required to induce the switching transformation depends on the voltage difference present between the two interconnection terminals 230 and 240. The greater the voltage difference is, the smaller in magnitude is the necessary control signal. Removal of a control signal or presence of a control signal of insufficient magnitude may be unable to induce a switching transformation, thereby producing or maintaining the chalcogenide material in a resistive state and inhibiting signal transmission or electrical communication between elements 200 and 210. Corresponding embodiments having more than three terminals in which a control terminal modulates the threshold voltage or conductivity of chalcogenide material between one or more pairs of non-control terminals are also within the scope of the instant invention.

Figure 13:
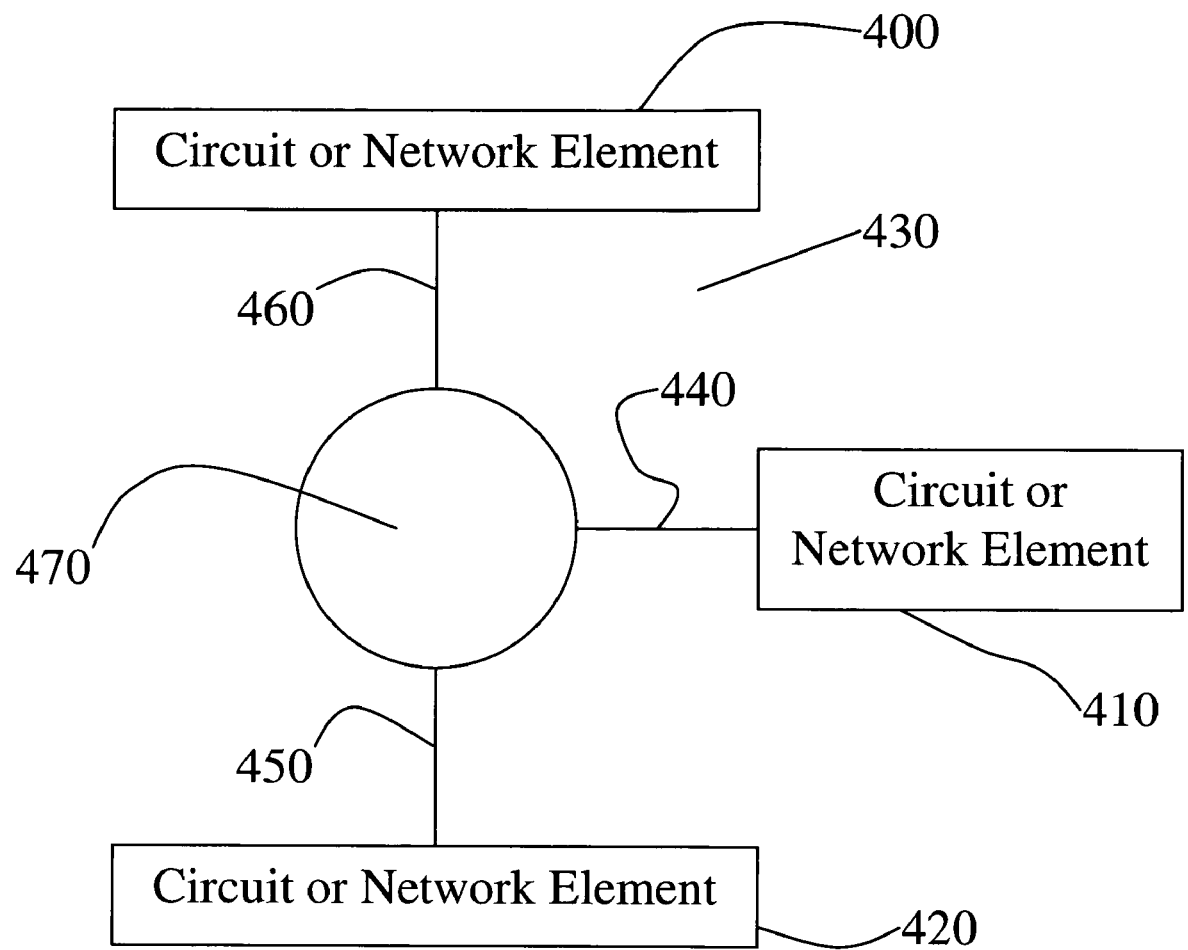
FIG. 13. Utilization of a three-terminal chalcogenide device as an interconnection device between three circuit or network elements.

In another embodiment, a three-terminal chalcogenide device is used to interconnect three circuit or network elements as shown in FIG. 13. In this embodiment, circuit or network elements 400, 410 and 420 are interconnected to each other through a three-terminal interconnection device 430 that includes interconnection terminals 440, 450 and 460 in electrical communication with chalcogenide 470. In this embodiment, any of the three interconnection terminals may be used as a control terminal for modulating the threshold voltage or conductivity of the chalcogenide material between the other two interconnection terminals. As an example, a signal provided by element 410 through interconnection terminal 440 may be used as a control signal with respect to the threshold voltage or conductivity of the chalcogenide material between interconnection terminals 450 and 460, thereby providing for modulation or control of signal transmission or electrical communication between elements 400 and 420. Element 400 and interconnection terminal 460 may similarly be used with respect to elements 410 and 420. Element 420 and interconnection terminal 450 may similarly be used with respect to elements 400 and 410. In this embodiment, the magnitude of a control signal is determined by the signal produced by a circuit or network element. Corresponding embodiments in which chalcogenide devices with more than three terminals are used to interconnect more than three circuit or network elements are also within the scope of the instant invention.

Figure 12:
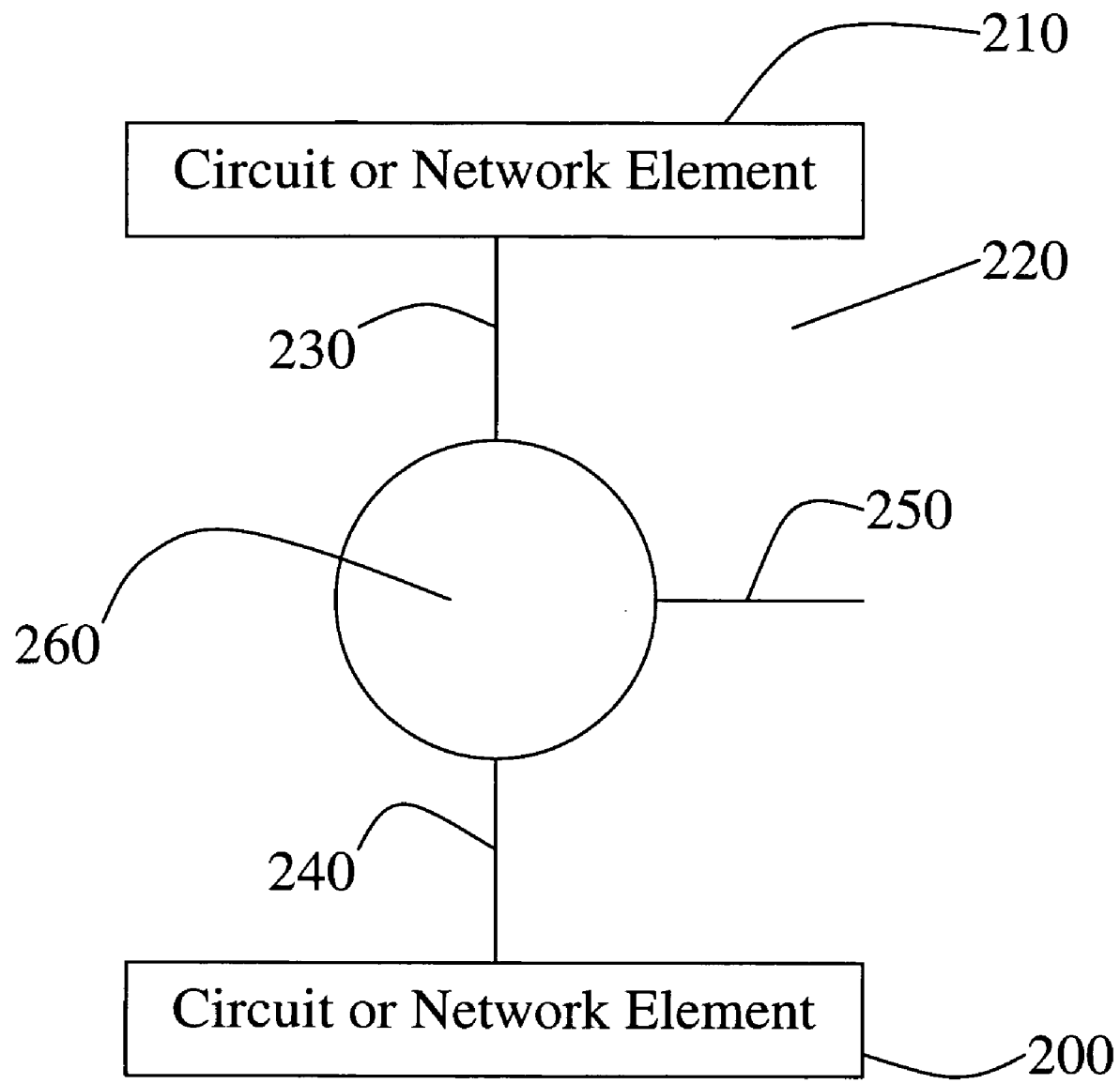
FIG. 12. Utilization of a three-terminal chalcogenide device as an interconnection device between two circuit or network elements.

Although the schematic depictions of FIGS. 12 and 13 indicate interconnection of circuits or network elements in a two-dimensional configuration, interconnection in three-dimension is also within the scope of the instant invention. One or more terminals may be vertically disposed or otherwise non-co-planar with the chalcogenide material or other terminals. A control signal, for example, may be provided from a terminal or device orthogonal to a plane in which a chalcogenide material may reside.

In other embodiment, the instant multi-terminal devices may provide signals to other devices or elements in circuits or networks. As described hereinabove, when a sub-threshold voltage is applied between two terminals (e.g. load and reference terminals) of a chalcogenide device, it is possible to induce a switching of the chalcogenide material between those two terminals through application of a control signal provided by a control terminal in electrical communication with the chalcogenide material. The switching is accompanied by a decrease in the magnitude of the voltage and an increase in the magnitude of the current between the load and reference terminals. These changes in voltage and current may be used as input signals to other devices or elements in a circuit or network. As an example, consider the device arrangement described in FIG. 12 hereinabove where the voltage across interconnection terminals 230 and 240 is a sub-threshold voltage and the chalcogenide material is in a resistive state. If a control signal of critical magnitude is subsequently applied to the control terminal 250, a switching of the chalcogenide material between interconnection terminals 230 and 240 to a conductive state occurs. The switching is accompanied by voltage and current changes between interconnection 230 and 240, as described hereinabove, and these voltage and current changes may be provided as input or driving signals to element 210 and/or element 200. The principles and modes of operation described herein for three-terminal embodiments of the instant invention extend analogously to multi-terminal devices having more than three terminals.

The disclosure and discussion set forth herein is illustrative and not intended to limit the practice of the instant invention. Numerous equivalents and variations thereof are envisioned to be within the scope of the instant invention. It is the following claims, including all equivalents, in combination with the foregoing disclosure, which define the scope of the instant invention.

I claim:

1. An electronic device comprising:
   a first terminal;
   a second terminal;
   a third terminal disposed between said first terminal and said second terminal, said third terminally consisting essentially of a conductive material, said third terminal having a first separation from said first terminal and a second separation from said second terminal; and
   a chalcogenide material in electrical communication with said first terminal and said second terminal, said chalcogenide material in contact with said third terminal, said chalcogenide material having a resistive state and a conductive state, said chalcogenide material transforming from said resistive state to said conductive state upon application of a threshold voltage between said first terminal and said second terminal;
   wherein said chalcogenide material does not transform from said resistive state to said conductive state upon application of said threshold voltage between said second terminal and said third terminal.

2. The electronic device of claim 1, wherein at least one of said terminals comprises carbon.

3. The device of claim 1, wherein at least one of said first terminal or said second terminal is a field effect terminal.

4. The device of claim 1, wherein at least one of said terminals comprises a chalcogenide material.

5. The device of claim 1, wherein said chalcogenide material comprises an element selected from the group consisting of S, Se, and Te.

6. The device of claim 5, wherein said chalcogenide material further comprises Ge or Sb.

7. The device of claim 5, wherein said chalcogenide material further comprises As or Si.

8. The device of claim 1, wherein said first terminal, said second terminal and said third terminal are arranged in a non-planar configuration.

9. The device of claim 1, further comprising one or more additional terminals in electrical communication with said chalcogenide material.

10. The electronic device of claim 1, wherein said device provides gain.

11. The electronic device of claim 10, wherein said gain is current gain between said first and second terminals, said gain being induced upon application of a signal to said third terminal.

12. A circuit comprising a first element, a second element and an interconnection element, said interconnection element controlling the electrical communication between said first and second elements, said interconnection element comprising the device of claim 1, said first element being in electrical communication with said first terminal, said second element being in electrical communication with said second terminal.

13. The circuit of claim 12, further comprising a third element said third element being in electrical communication with said third terminal of said interconnection element.

14. The device of claim 1, wherein said chalcogenide material is a threshold switching material.

15. The device of claim 1, wherein said chalcogenide material transforms from said resistive state to said conductive state upon application of said threshold voltage between said third terminal and said first terminal.

16. The device of claim 1, wherein said chalcogenide material is a phase-change material.

17. The device of claim 16, wherein said chalcogenide material has an amorphous phase portion and a crystalline phase portion.

18. The device of claim 17, wherein said transformation of said chalcogenide material from said resistive state to said conductive state includes a change in the relative proportions of said amorphous phase portion and said crystalline phase portion.

19. The device of claim 1, wherein the current-voltage response between said second terminal and said third terminal is monotonic between zero volts and a voltage exceeding said threshold voltage.

20. The device of claim 1, wherein said first terminal contacts said chalcogenide material.

21. The device of claim 20, wherein said second terminal contacts said chalcogenide material.

* * * * *